United States Patent
Mushiake et al.

(10) Patent No.: US 8,999,871 B2
(45) Date of Patent: Apr. 7, 2015

(54) HIGH REFRACTIVE INDEX GLASS

(75) Inventors: Atsushi Mushiake, Shiga (JP); Takashi Murata, Shiga (JP); Tomoki Yanase, Shiga (JP)

(73) Assignee: Nippon Electric Glass Co., Ltd., Shiga (JP)

( * ) Notice: Subject to any disclaimer, the term of this patent is extended or adjusted under 35 U.S.C. 154(b) by 245 days.

(21) Appl. No.: 13/474,820

(22) Filed: May 18, 2012

(65) Prior Publication Data

US 2013/0011607 A1 Jan. 10, 2013

Related U.S. Application Data

(60) Provisional application No. 61/489,833, filed on May 25, 2011.

(51) Int. Cl.

| | | |
|---|---|---|
| *C03C 3/062* | (2006.01) | |
| *C03C 3/078* | (2006.01) | |
| *C03C 3/093* | (2006.01) | |
| *C03C 3/064* | (2006.01) | |
| *C03C 3/087* | (2006.01) | |
| *C03C 3/089* | (2006.01) | |
| *C03C 3/095* | (2006.01) | |
| *C03C 3/097* | (2006.01) | |
| *H01L 51/00* | (2006.01) | |
| *H01L 51/52* | (2006.01) | |

(52) U.S. Cl.
CPC .......... *C03C 3/093* (2013.01); *Y10T 428/24355* (2015.01); *C03C 3/062* (2013.01); *C03C 3/064* (2013.01); *C03C 3/078* (2013.01); *C03C 3/087* (2013.01); *C03C 3/089* (2013.01); *C03C 3/095* (2013.01); *C03C 3/097* (2013.01); *B32B 2457/206* (2013.01); *H01L 51/0096* (2013.01); *H01L 51/5275* (2013.01); *Y02E 10/549* (2013.01)

(58) Field of Classification Search
CPC .......... C03C 3/062; C03C 3/078; C03C 3/064
USPC .............. 501/65, 66, 72, 77, 78, 79
See application file for complete search history.

(56) References Cited

U.S. PATENT DOCUMENTS

| | | | | |
|---|---|---|---|---|
| 4,055,435 A | * | 10/1977 | Sagara ................. | 501/63 |
| 4,285,731 A | * | 8/1981 | Nigrin ................. | 501/21 |
| 5,300,467 A | * | 4/1994 | Ishizaki et al. ........ | 501/67 |
| 5,851,939 A | * | 12/1998 | Miwa ................. | 501/70 |
| 5,854,152 A | * | 12/1998 | Kohli et al. ........... | 501/70 |
| 6,465,381 B1 | * | 10/2002 | Lautenschlager et al. | 501/67 |
| 6,468,933 B1 | * | 10/2002 | Narita et al. ........... | 501/56 |
| 8,298,973 B2 | * | 10/2012 | Berthereau et al. ..... | 501/38 |
| 2004/0029702 A1 | * | 2/2004 | Naumann et al. ........ | 501/70 |
| 2005/0049134 A1 | * | 3/2005 | Komori ............... | 501/72 |
| 2005/0181926 A1 | * | 8/2005 | Fechner et al. ........ | 501/70 |
| 2007/0191207 A1 | * | 8/2007 | Danielson et al. ...... | 501/66 |
| 2008/0194394 A1 | * | 8/2008 | Lecomte .............. | 501/67 |
| 2009/0088309 A1 | * | 4/2009 | Niida et al. ........... | 501/59 |
| 2010/0160528 A1 | * | 6/2010 | Fujiwara et al. ........ | 524/492 |
| 2013/0230692 A1 | * | 9/2013 | Yanase et al. .......... | 428/141 |

FOREIGN PATENT DOCUMENTS

| | | |
|---|---|---|
| JP | 2005-139023 | 6/2005 |
| JP | 2005-350279 | 12/2005 |
| JP | 2007-149460 | 6/2007 |
| JP | 2009-286680 | 12/2009 |
| JP | 2010-180076 | 8/2010 |
| JP | 2010-248046 | 11/2010 |

OTHER PUBLICATIONS

Machine Translation of JP 2009-286680 A, Dec. 10, 2009.*
International Search Report issued Aug. 7, 2012 in International (PCT) Application No. PCT/JP2012/062610.
International Preliminary Report on Patentability and Written Opinion of the International Searching Authority issued Nov. 28, 2013 in International (PCT) Application No. PCT/JP2012/062610.

* cited by examiner

*Primary Examiner* — Anthony J Green
*Assistant Examiner* — Elizabeth A Bolden
(74) *Attorney, Agent, or Firm* — Wenderoth, Lind & Ponack, L.L.P.

(57) ABSTRACT

Provided is a high refractive index glass, comprising, as a glass composition in terms of mass %, 0 to 10% of $B_2O_3$, 0.001 to 35% of SrO, 0.001 to 30% of $ZrO_2+TiO_2$, and 0 to 10% of $La_2O_3+Nb_2O_5$, having a mass ratio of BaO/SrO of 0 to 40 and a mass ratio of $SiO_2$/SrO of 0.1 to 40, and having a refractive index nd of 1.55 to 2.3.

6 Claims, No Drawings

HIGH REFRACTIVE INDEX GLASS

This application claims the benefit of U.S. provisional application No. 61/489,833, filed May 25, 2011, the contents of which are incorporated by reference.

TECHNICAL FIELD

The present invention relates to a high refractive index glass, and more specifically, to a high refractive index glass suitable for, for example, an OLED device, in particular, an OLED lighting device.

BACKGROUND ART

In recent years, attention has been increasingly paid to a display and a lighting device which use an OLED light-emitting element. Each of the OLED devices has a structure in which an organic light-emitting element is sandwiched by substrates (glass sheets) on which a transparent conductive film such as an ITO or FTO film is formed (see, for example, Patent Literature 1). When an electric current flows through the organic light-emitting element in this structure, a hole and an electron in the organic light-emitting element are combined to emit light. The emitted light enters a glass sheet via the transparent conductive film and is released out while repeating reflection in the glass sheet.

CITATION LIST

Patent Literature 1: JP 2007-149460 A

SUMMARY OF INVENTION

Technical Problem

Meanwhile, an organic light-emitting element has a refractive index nd of 1.8 to 1.9, and transparent electrode film has a refractive index nd of 1.9 to 2.0. On the other hand, a glass substrate usually has a refractive index nd of about 1.5. Thus, a conventional OLED device involves a problem in that a difference in refractive index between the glass substrate and the ITO film at their interface leads to a high reflectance, and hence light emitted from the organic light-emitting element cannot be extracted efficiently.

When a high refractive index glass is used as a glass sheet, the difference in the refractive index between the glass sheet and the transparent electrode film at their interface can be reduced.

An optical glass used for an optical lens and the like is known as a high refractive index glass. An optical glass obtained by forming glass into a droplet glass having a spherical shape by a droplet forming method or the like, and press-forming the droplet glass so as to have a predetermined shape while applying heat treatment again to the droplet glass is used for the optical lens and the like. This optical glass has a high refractive index nd but has a low liquidus viscosity, and hence the optical glass needs to be formed by, for example, a droplet forming method which is performed at a fast cooling rate, because denitrification of glass occurs at the time of forming the glass into the optical glass otherwise. Thus, it is necessary to enhance the devitrification resistance of the high refractive index glass in order to solve the above-mentioned problem.

Meanwhile, with a reduction in thickness of an OLED display or the like and an increase in size thereof, the development of a glass sheet having a smaller thickness and a larger area has been required. It is necessary for producing such glass sheet to form glass into a glass sheet by a float method or a down-draw method (overflow down-draw method or slot down-draw method). However, because conventional high refractive index glass had a low liquidus viscosity, the high refractive index glass was not able to be formed into a glass sheet by the float method or the down-draw method, and hence it was difficult to form the glass into a glass sheet having a reduced thickness and an increased size. Note that the development of a glass sheet having a reduced thickness and an increased size for an OLED lighting device has also been requested.

On the other hand, when oxides, in particular, $La_2O_3$, $Nb_2O_5$, and $Gd_2O_3$, are added in the composition of glass, the refractive index nd of the resultant glass sheet can be increased while the reduction of the liquidus viscosity of the glass is suppressed to a certain extent. However, these rare metal oxides involve a problem in that their material costs are high. Further, when rare metal oxides are added in the composition of glass in a large amount, the devitrification resistance of the glass lowers and it becomes difficult to form the glass into a glass sheet. Note that, when rare metal oxides are added in glass in a large amount, the acid resistance of the glass also lowers.

Thus, a technical object of the present invention is to provide a high refractive index glass which has a refractive index nd matching to that of an organic light-emitting element and that of a transparent electrode film and has good denitrification resistance even though the content of rare metal oxides (in particular, $La_2O_3$, $Nb_2O_5$, and $Gd_2O_3$) is small.

Solution to Problem

<First Invention>

The inventors of the present invention have made extensive studies, and have consequently found that the above-mentioned technical object can be achieved by restricting the content range of each component and the refractive index of the resultant high refractive index glass to each predetermined range. The finding is proposed as a first invention. That is, a high refractive index glass of the first invention comprises, as a glass composition in terms of mass %, 0 to 10% of $B_2O_3$, 0.001 to 35% of SrO, 0.001 to 30% of $ZrO_2+TiO_2$, 0 to 10% of $La_2O_3+Nb_2O_5$, having a mass ratio of BaO/SrO of 0 to 40 and a mass ratio of $SiO_2$/SrO of 0.1 to 40, and having a refractive index nd of 1.55 to 2.3. Herein, the "$ZrO_2+TiO_2$" refers to the total amount of $ZrO_2$ and $TiO_2$. The "$La_2O_3+Nb_2O_5$" refers to the total amount of $La_2O_3$ and $Nb_2O_5$. The "refractive index nd" can be measured with a commercially available refractometer, and can be measured, for example, by producing samples having a rectangular parallelepiped shape of 25 mm by 25 mm by about 3 mm, then subjecting the samples to annealing treatment at a cooling rate of 0.1° C./min in the temperature range from (annealing point Ta+30° C.) to (strain point Ps-50° C.), and subsequently using a refractometer KPR-2000 manufactured by Shimadzu Corporation in a state in which an immersion liquid having a refractive index matching to that of the samples is immersed between two glass samples. The "annealing point Ta" refers to a value obtained through measurement based on a method as described in ASTM C338-93. The "strain point Ps" refers to a value obtained through measurement based on a method as described in ASTM C336-71.

Second, the high refractive index glass of the first invention preferably has a liquidus viscosity of $10^{3.0}$ dPa·s or more. Herein, the "liquidus viscosity" refers to a value obtained by measuring the viscosity of glass at its liquidus temperature by a platinum sphere pull up method. The "liquidus temperature" refers to a value obtained by measuring a temperature at which crystals of glass deposit after glass powder that has passed though a standard 30-mesh sieve (500 μm) and remained on a 50-mesh sieve (300 μm) is placed in a platinum boat and kept in a gradient heating furnace for 24 hours.

Third, the high refractive index glass of the first invention preferably has a sheet shape. Herein, the term "sheet shape" is not restrictively interpreted, comprises a film shape having a small thickness, such as the shape of a film-shaped glass arranged along a cylindrical product, and also comprises the shape of a glass sheet having formed irregularities in one surface thereof.

Fourth, the high refractive index glass of the first invention is preferably formed by a float method.

Fifth, the high refractive index glass of the first invention preferably has a temperature at $10^4$ dPa·s of 1,250° C. or less. Herein, the "temperature at $10^4$ dPa·s" refers to a value obtained by measurement using a platinum sphere pull up method.

Sixth, the high refractive index glass of the first invention preferably has a strain point of 650° C. or more.

Seventh, the high refractive index glass of the first invention is preferably used in a lighting device.

Eighth, the high refractive index glass of the first invention is preferably used in an OLED lighting device.

Ninth, the high refractive index glass of the first invention is preferably used in an OLED display.

Tenth, a high refractive index glass of the first invention comprises, as a glass composition in terms of mass %, 0 to 8% of $B_2O_3$, 0.001 to 35% of SrO, 0 to 12% of ZnO, 0.001 to 30% of $ZrO_2+TiO_2$, 0 to 5% of $La_2O_3+Nb_2O_5$, and 0 to 10% of $Li_2O+Na_2O+K_2O$, has a mass ratio of BaO/SrO of 0 to 20, a mass ratio of $SiO_2$/SrO of 0.1 to 20, and a mass ratio of (MgO+CaO)/SrO of 0 to 20, and has a refractive index nd of 1.58 or more, a liquidus viscosity of $10^{3.5}$ dPa·s or more, and a strain point of 670° C. or more. Herein, the "$Li_2O+Na_2O+K_2O$" refers to the total amount of $Li_2O$, $Na_2O$, and $K_2O$. The "MgO+CaO" refers to the total amount of MgO and CaO.

Eleventh, a high refractive index glass of the first invention comprises, as a glass composition in terms of mass %, 10 to 50% of $SiO_2$, 0 to 8% of $B_2O_3$, 0 to 10% of CaO, 0.001 to 35% of SrO, 0 to 30% of BaO, 0 to 4% of ZnO, 0.001 to 30% of $ZrO_2+TiO_2$, 0 to 5% of $La_2O_3+Nb_2O_5$, and 0 to 2% of $Li_2O+Na_2O+K_2O$, has a mass ratio of BaO/SrO of 0 to 20, a mass ratio of $SiO_2$/SrO of 1 to 15, and a mass ratio of (MgO+CaO)/SrO of 0 to 20, and has a refractive index nd of 1.6 or more, a liquidus viscosity of $10^{4.0}$ dPa·s or more, and a strain point of 670° C. or more.

Twelfth, a glass sheet for a lighting device of the first invention comprises, as a glass composition in terms of mass %, 0.1 to 60% of $SiO_2$, 0 to 10% of $B_2O_3$, 0.001 to 35% of SrO, 0 to 40% of BaO, 0.001 to 30% of $ZrO_2+TiO_2$, and 0 to 10% of $La_2O_3+Nb_2O_5$, and has a refractive index nd of 1.55 to 2.3.

Thirteenth, a glass sheet for an OLED lighting device of the first invention comprises, as a glass composition in terms of mass %, 0.1 to 60% of $SiO_2$, 0 to 10% of $B_2O_3$, 0.001 to 35% of SrO, 0 to 40% of BaO, 0.001 to 30% of $ZrO_2+TiO_2$, and 0 to 10% of $La_2O_3+Nb_2O_5$, and has a refractive index nd of 1.55 to 2.3.

Fourteenth, a glass sheet for an OLED display of the first invention comprises, as a glass composition in terms of mass %, 0.1 to 60% of $SiO_2$, 0 to 10% of $B_2O_3$, 0.001 to 35% of SrO, 0 to 40% of BaO, 0.001 to 30% of $ZrO_2+TiO_2$, and 0 to 10% of $La_2O_3+Nb_2O_5$, and has a refractive index nd of 1.55 to 2.3.

Fifteenth, a high refractive index glass of the first invention comprises, as a glass composition in terms of mass %, 35 to 60% of $SiO_2$, 0 to 1.5% of $Li_2O+Na_2O+K_2O$, 0.1 to 35% of SrO, 0 to 35% of BaO, 0.001 to 25% of $TiO_2$, and 0 to 9% of $La_2O_3+Nb_2O_5+Gd_2O_3$, and having a refractive index nd of 1.55 to 2.3. Herein, the "$La_2O_3+Nb_2O_5+Gd_2O_3$" refers to the total amount of $La_2O_3$, $Nb_2O_5$, and $Gd_2O_3$.

Sixteenth, a high refractive index glass of the first invention comprises, as a glass composition in terms of mass %, 35 to 60% of $SiO_2$, 0 to 1.5% of $Li_2O+Na_2O+K_2O$, 0.1 to 20% of SrO, 17 to 35% of BaO, 0.01 to 20% of $TiO_2$, and 0 to 9% of $La_2O_3+Nb_2O_5+Gd_2O_3$, and having a refractive index nd of 1.55 to 2.3.

Seventeenth, the high refractive index glass of the first invention preferably further comprises 0 to 3 mass % of $B_2O_3$.

Eighteenth, the high refractive index glass of the first invention preferably further comprises 0 to 3 mass % of MgO.

Nineteenth, the high refractive index glass of the first invention preferably further comprises 1 to 20 mass % of $ZrO_2+TiO_2$.

Twentieth, the high refractive index glass of the first invention is preferably formed by a down-draw method. Herein, the "down-draw method" refers to, for example, an overflow down-draw method, a slot down-draw method, or a redraw method.

<Second Invention>

The inventors of the present invention have made extensive studies, and have consequently found that the above-mentioned technical object can be achieved by restricting the composition range of glass to a predetermined range. The finding is proposed as a second invention. That is, a high refractive index glass of the second invention comprises, as a glass composition in terms of mass %, 30 to 60% of $SiO_2$, 0 to 15% of $B_2O_3$, 0 to 15% of $Al_2O_3$, 0 to 10% of $Li_2O$, 0 to 10% of $Na_2O$, 0 to 10% of $K_2O$, 20 to 60% of MgO+CaO+SrO+BaO+ZnO, 0.0001 to 20% of $TiO_2$, 0 to 20 of $ZrO_2$, and 0 to 10% of $La_2O_3+Nb_2O_5$, and having a mass ratio of BaO/SrO of 0 to 40 and a mass ratio of $SiO_2$/SrO of 0.1 to 40, and having a refractive index nd of 1.55 to 2.3. Herein, the "MgO+CaO+SrO+BaO+ZnO" refers to the total amount of MgO, CaO, SrO, BaO, and ZnO. The "$La_2O_3+Nb_2O_5$" refers to the total amount of $La_2O_3$ and $Nb_2O_5$. The "refractive index nd" can be measured with a refractometer, and can be measured, for example, by producing samples having a rectangular parallelepiped shape of 25 mm by 25 mm by about 3 mm, then subjecting the samples to annealing treatment at a cooling rate of 0.1° C./min in the temperature range from (annealing point Ta+30° C.) to (strain point Ps-50° C.), and subsequently using a refractometer KPR-200 manufactured by Kalnew Co., Ltd. in a state in which an immersion liquid having a refractive index nd matching to that of the samples is immersed between two glass samples. The "annealing point Ta" refers to a value obtained through measurement based on a method as described in ASTM C338-93. The "strain point Ps" refers to a value obtained through measurement based on a method as described in ASTM C336-71.

A high refractive index glass of the second invention comprises 30 to 60% of $SiO_2$, 0 to 15% of $B_2O_3$, 0 to 15% of $Al_2O_3$, 20 to 60% of MgO+CaO+SrO+BaO+ZnO, 0.0001 to 20% of $TiO_2$, and 0 to 20% of $ZrO_2$. With this, the devitrification resistance of the high refractive index glass can be enhanced while its refractive index nd is increased.

The high refractive index glass of the second invention comprises 0 to 10% of $La_2O_3+Nb_2O_5$. As a result, its material cost can be reduced and its devitrification resistance and acid resistance can be easily enhanced.

The high refractive index glass of the second invention comprises 0 to 10% of $Li_2O$, 0 to 10% of $Na_2O$, and 0 to 10% of $K_2O$. As a result, its acid resistance improves, and even if these alkali components elute in an etching step with acid, the glass does not easily become cloudy. Note that, for example, the production process of an OLED display or the like comprises the etching step with acid, and hence, when a glass sheet has low acid resistance, the glass sheet is corroded in the etching step and becomes cloudy. When the glass sheet is cloudy, the transmittance of the glass sheet lowers, resulting in difficulty in producing a display having a high definition.

The high refractive index glass of the second invention has a refractive index nd of 1.55 to 2.3. As a result, the high refractive index glass has a refractive index nd easily matching to that of an organic light-emitting element and that of a transparent electrode film, and light emitted from an organic light-emitting element can be extracted out efficiently.

Second, the high refractive index glass of the second invention preferably comprises, as a glass composition in terms of mass %, 35 to 60% of $SiO_2$, 0 to 15% of $B_2O_3$, 0 to 15% of $Al_2O_3$, 0 to 10% of $Li_2O$, 0 to 10% of $Na_2O$, 0 to 10% of $K_2O$, 20 to 60% of $MgO+CaO+SrO+BaO+ZnO$, 0.0001 to 20% of $TiO_2$, 0.0001 to 20% of $ZrO_2$, and 0 to 10% of $La_2O_3+Nb_2O_5$, and has a refractive index nd of 1.55 to 2.3.

Third, the high refractive index glass of the second invention preferably comprises, as a glass composition in terms of mass %, 35 to 60% of $SiO_2$, 0 to 15% of $B_2O_3$, 0 to 15% of $Al_2O_3$, 0 to 1% of $Li_2O$, 0 to 1% of $Na_2O$, 0 to 1% of $K_2O$, 0 to 1% of $Li_2O+Na_2O+K_2O$, 20 to 50% of $MgO+CaO+SrO+BaO+ZnO$, 0.1 to 35% of BaO, 0.0001 to 20% of $TiO_2$, 0.0001 to 20% of $ZrO_2$, and 0 to 10% of $La_2O_3+Nb_2O_5$, and has a refractive index nd of 1.55 to 2.3. Herein, the "$Li_2O+Na_2O+K_2O$" refers to the total amount of $Li_2O$, $Na_2O$, and $K_2O$.

Fourth, the high refractive index glass of the second invention preferably comprises 1 mass % or more of $B_2O_3$.

Fifth, in the high refractive index glass of the second invention the content of MgO is preferably 1 mass % or more.

Sixth, the high refractive index glass of the second invention preferably has a sheet shape. With this, the high refractive index glass is easily applicable to a substrate for various devices such as an OLED display, an OLED lighting device, and an organic thin-film solar cell. Herein, the term "sheet shape" is not restrictively interpreted, comprises a film shape having a small thickness, such as the shape of a film-shaped glass arranged along a cylindrical product, and also comprises the shape of a glass sheet having formed irregularities in one surface thereof.

Seventh, the high refractive index glass of the second invention preferably has a liquidus viscosity of $10^{3.0}$ dPa·s or more. An OLED lighting device or the like involves a problem in that, when the surface smoothness of a glass sheet used therein differs even slightly depending on parts of its surfaces, the density of an electric current varies at the time of applying the electric current, causing the unevenness of the intensity of illumination. Further, when the surfaces of a glass sheet are polished to increase its surface smoothness, there occurs a problem in that the processing cost of the glass sheet surges. Thus, when the liquidus viscosity of a high refractive index glass is controlled in the above-mentioned range, the glass can be easily formed into a glass sheet by an overflow down-draw method or the like, and consequently, a glass sheet having good surface smoothness can be easily manufactured even if its surfaces are not polished. Herein, the "liquidus viscosity" refers to a value obtained by measuring the viscosity of glass at its liquidus temperature by a platinum sphere pull up method. The "liquidus temperature" refers to a value obtained by measuring a temperature at which crystals of glass deposit when glass powder that has passed though a standard 30-mesh sieve (500 μm) and remained on a 50-mesh sieve (300 μm) is placed in a platinum boat and kept in a gradient heating furnace for 24 hours. The term "overflow down-draw method" refers to a method comprising causing molten glass to overflow from both sides of a heat-resistant, trough-shaped structure, and subjecting the overflowing molten glass to down-draw downward while joining the flows of the overflowing molten glass at the lower end of the trough-shaped structure, to thereby form the molten glass into a glass sheet.

Eighth, the high refractive index glass of the second invention is preferably formed by a float method or a down-draw method. Herein, the "down-draw method" refers to, for example, an overflow down-draw method or a slot down-draw method.

Ninth, at least one surface of the high refractive index glass of the second invention preferably comprises an unpolished surface, the unpolished surface having a surface roughness Ra of 10 Å or less. Herein, the term "surface roughness Ra" refers to a value obtained through measurement by a method in accordance with JIS B0601: 2001.

Advantageous Effects of Invention

According to the first invention and the second invention, it is possible to provide the high refractive index glass which has a refractive index nd matching to that of an organic light-emitting element and that of a transparent electrode film and has good devitrification resistance while the content of rare metal oxides (in particular, $La_2O_3$, $Nb_2O_5$, and $Gd_2O_3$) is decreased.

DESCRIPTION OF EMBODIMENTS

First Embodiment

A high refractive index glass according to an embodiment of the first invention (hereinafter, referred to as first embodiment) comprises, as a glass composition in terms of mass %, 0 to 10% of $B_2O_3$, 0.001 to 35% of SrO, 0.001 to 30% of $ZrO_2+TiO_2$, and 0 to 10% of $La_2O_3+Nb_2O_5$, and has a mass ratio of BaO/SrO of 0 to 40 and a mass ratio of $SiO_2$/SrO of 0.1 to 40. The reasons why the content range of each component has been restricted as mentioned above are described below. Note that, in the following description of the content range, the expression "%" refers to "mass %" unless otherwise specified.

The content of $B_2O_3$ is preferably 0 to 10%. As the content of $B_2O_3$ increases in glass, its refractive index nd and Young's modulus are liable to lower. Thus, the upper limit range of $B_2O_3$ is suitably 8% or less, 5% or less, 4% or less, 3% or less, less than 2%, 1% or less, particularly suitably less than 1%.

The content of SrO is 0.001 to 35%. Among alkaline-earth metal oxides, SrO is a component that has a relatively large effect of increasing the refractive index nd of glass while suppressing its devitrification property. However, when the content of SrO increases in glass, its refractive index nd, density, and thermal expansion coefficient increase, and the balance among the components of the glass is lost in the glass composition, with the result that its devitrification resistance is liable to deteriorate. Thus, the upper limit range of SrO is suitably 30% or less, 25% or less, 20% or less, 15% or less, 12% or less, 10% or less, particularly suitably 8% or less. The lower limit range of SrO is suitably 0.01% or more, 0.1% or more, 1% or more, 2% or more, 3% or more, 3.5% or more, particularly suitably 4% or more.

The content of $ZrO_2+TiO_2$ is preferably 0.001 to 30%. When the content of $TiO_2+ZrO_2$ increases in glass, its devitrification resistance may be liable to deteriorate and its density and thermal expansion coefficient may be too high. On the other hand, when the content of $TiO_2+ZrO_2$ decreases in glass, its refractive index nd is liable to lower. Thus, the upper limit range of $TiO_2+ZrO_2$ is suitably 25% or less, 20% or less, 18% or less, 15% or less, 14% or less, particularly suitably 13% or less. The lower limit range of $TiO_2+ZrO_2$ is suitably 0.01% or more, 0.5% or more, 1% or more, 3% or more, 5% or more, 6% or more, particularly suitably 7% or more.

The content of $TiO_2$ is preferably 0 to 30%. $TiO_2$ is a component that increases the refractive index nd of glass. However, when the content of $TiO_2$ increases in glass, its density and thermal expansion coefficient are apt to become too high, its devitrification resistance is liable to deteriorate, and its transmittance tends to lower. Thus, the upper limit range of $TiO_2$ is suitably 25% or less, 15% or less, 12% or less, particularly suitably 8% or less. The lower limit range of $TiO_2$ is suitably 0.001% or more, 0.01% or more, 0.5% or more, 1% or more, particularly suitably 3% or more.

The content of $ZrO_2$ is preferably 0 to 30%. $ZrO_2$ is a component that has large effects of increasing the refractive index nd of glass and increasing the viscosity of glass at around its liquidus temperature. However, when the content of $ZrO_2$ increases in glass, its density becomes too high and its devitrification resistance is liable to deteriorate. Thus, the upper limit range of $ZrO_2$ is suitably 15% or less, 10% or less, 7% or less, particularly suitably 6% or less. The lower limit range of $ZrO_2$ is suitably 0.001% or more, 0.01% or more, 0.5% or more, 1% or more, 2% or more, particularly suitably 3% or more.

The content of $La_2O_3+Nb_2O_5$ is preferably 0 to 10%. When the content of $La_2O_3+Nb_2O_5$ increases in glass, its refractive index nd tends to be higher. However, when the content of $La_2O_3+Nb_2O_5$ is more than 10% in glass, the balance among the components of the glass is lost in the glass composition, resulting in the deterioration of its devitrification resistance, and the material cost of the glass rises, possibly resulting in the surge of its production cost. Inexpensive glass is required particularly in applications such as lighting devices, and hence an increase in material cost is not preferred. Thus, the lower limit range of $La_2O_3+Nb_2O_5$ is suitably 8% or less, 5% or less, 3% or less, 2% or less, 1% or less, 0.5% or less, particularly suitably 0.1% or less.

$La_2O_3$ is a component that increases the refractive index nd of glass. When the content of $La_2O_3$ increases in glass, its devitrification resistance is liable to deteriorate and its density and thermal expansion coefficient may become too high. Thus, the content of $La_2O_3$ is preferably 10% or less, 9% or less, 8% or less, 5% or less, 2% or less, 1% or less, 0.5% or less, particularly preferably 0.1% or less.

$Nb_2O_5$ is a component that increases the refractive index nd of glass. When the content of $Nb_2O_5$ increases in glass, its devitrification resistance is liable to deteriorate and its density and thermal expansion coefficient may become too high. Thus, the content of $Nb_2O_5$ is preferably 10% or less, 9% or less, 8% or less, 5% or less, 2% or less, 1% or less, 0.5% or less, particularly preferably 0.1% or less.

The mass ratio of $(La_2O_3+Nb_2O_5)/(ZrO_2+TiO_2)$ is preferably 0 to 30. As the mass ratio of $(La_2O_3+Nb_2O_5)/(ZrO_2+TiO_2)$ is larger in glass, its refractive index nd can be increased while its devitrification resistance is suppressed from deteriorating. However, when the value of the mass ratio is too large in glass, the balance among the components of the glass is lost in the glass composition, resulting in the deterioration of its devitrification resistance, and the material cost of the glass becomes too high. Thus, the upper limit range of the mass ratio of $(La_2O_3+Nb_2O_5)/(ZrO_2+TiO_2)$ is suitably 20 or less, 10 or less, 5 or less, 2 or less, 1 or less, 0.1 or less, particularly suitably 0.01 or less.

The mass ratio of BaO/SrO is 0 to 40. When the mass ratio of BaO/SrO is too large in glass, its devitrification resistance may deteriorate and its density and thermal expansion coefficient may become too high. On the other hand, when the mass ratio of BaO/SrO is too small in glass, its refractive index nd may lower, and the balance among the components of the glass is lost in the glass composition, possibly resulting in the deterioration of its denitrification resistance. Thus, the upper limit range of the mass ratio of BaO/SrO is suitably 30 or less, 20 or less, 10 or less, 8 or less, particularly suitably 5 or less. The lower limit range of the mass ratio of BaO/SrO is suitably 0.1 or more, 0.5 or more, 1 or more, 2.5 or more, particularly suitably 3 or more.

Among alkaline-earth metal oxides, BaO is a component that increases the refractive index nd of glass without reducing its viscosity extremely. The content of BaO is preferably 0 to 40%. When the content of BaO increases in glass, its refractive index nd, density, and thermal expansion coefficient are apt to increase. However, when the content of BaO is more than 40% in glass, the balance among the components of the glass is lost in the glass composition, with the result that its denitrification resistance is liable to deteriorate. Thus, the upper limit range of BaO is suitably 35% or less, 32% or less, 30% or less, 29.5% or less, 29% or less, particularly suitably 28% or less. Note that, when the content of BaO decreases in glass, it becomes difficult for the glass to have a desired refractive index nd and keep a high liquidus viscosity. Thus, the lower limit range of BaO is suitably 0.5% or more, 1% or more, 2% or more, 5% or more, 10% or more, 15% or more, 17% or more, 20% or more, 23% or more, particularly suitably 25% or more.

The mass ratio of $SiO_2/SrO$ is 0.1 to 40. When the mass ratio of $SiO_2/SrO$ is too large in glass, its refractive index nd is liable to lower. On the other hand, when the mass ratio of $SiO_2/SrO$ is too small in glass, its denitrification resistance may deteriorate and its density and thermal expansion coefficient may become too high. Thus, the upper limit range of the mass ratio of $SiO_2/SrO$ is suitably 30 or less, 20 or less, 15 or less, 10 or less, 9 or less, particularly suitably 8 or less. The lower limit range of the mass ratio of $SiO_2/SrO$ is suitably 0.5 or more, 1 or more, 2 or more, 2.5 or more, particularly suitably 3 or more.

The content of $SiO_2$ is preferably 0.1 to 60%. When the content of $SiO_2$ increases in glass, its meltability and formability are liable to deteriorate, and its refractive index nd is liable to lower. Thus, the content of $SiO_2$ is preferably 55% or less, 53% or less, 52% or less, 50% or less, 49% or less, 48% or less, particularly preferably 45% or less. On the other hand, when the content of $SiO_2$ decreases in glass, its network structure is not easily formed, resulting in difficulty in vitrification, and the viscosity of the glass becomes too low, with the result that it is difficult for the glass to keep a high liquidus viscosity. Thus, the content of $SiO_2$ is preferably 3% or more, 5% or more, 10% or more, 15% or more, 20% or more, 25% or more, 30% or more, 35% or more, particularly preferably 40% or more.

The content of $Al_2O_3$ is preferably 0 to 20%. When the content of $Al_2O_3$ increases in glass, devitrified crystals are liable to deposit in the glass, its liquidus viscosity is liable to lower, and its refractive index nd is liable to lower. Thus, the upper limit range of $Al_2O_3$ is suitably 15% or less, 10% or less, 8% or less, particularly suitably 6% or less. Note that, when the content of $Al_2O_3$ decreases in glass, the balance among the components of the glass is lost in the glass composition, with the result that the glass is also liable to denitrify. Thus, the lower limit range of $Al_2O_3$ is suitably 0.1% or more, 0.5% or more, 1% or more, particularly suitably 3% or more.

The content of MgO is preferably 0 to 10%. MgO is a component that increases the refractive index nd of glass, its Young's modulus, and its strain point and is a component that decreases its viscosity at high temperature. However, when MgO is added in a large amount in glass, its liquidus temperature rises, with the result that its denitrification resistance may deteriorate, and its density and thermal expansion coefficient may become too high. Thus, the upper limit range of MgO is suitably 5% or less, 3% or less, 2% or less, 1.5% or less, 1% or less, particularly suitably 0.5% or less.

The content of CaO is preferably 0 to 10%. When the content of CaO increases in glass, its density and thermal expansion coefficient are liable to be higher. Further, when the content of CaO is too large in glass, the balance among the components of the glass is lost in the glass composition, with the result that its devitrification resistance is liable to deteriorate. Thus, the upper limit range of CaO is suitably 9% or less, particularly suitably 8.5% or less. Note that, when the content of CaO decreases in glass, its meltability deteriorates, its Young's modulus lowers, and its refractive index nd is liable to lower. Thus, the lower limit range of CaO is suitably 0.5% or more, 1% or more, 2% or more, 3% or more, particularly suitably 4% or more.

The mass ratio of (MgO+CaO)/SrO is preferably 0 to 20. When the mass ratio of (MgO+CaO)/SrO increases in glass, its density can be reduced and its viscosity at high temperature can be reduced while its high refractive index nd is maintained, but its liquidus temperature is liable to increase, with the result that it is difficult to maintain its high liquidus viscosity. Thus, the upper limit range of the mass ratio of (MgO+CaO)/SrO is suitably 10 or less, 8 or less, 5 or less, 3 or less, 2 or less, particularly suitably 1 or less.

The content of ZnO is preferably 0 to 12%. When the content of ZnO increases in glass, its density and thermal expansion coefficient become too high, the balance among the components of the glass is lost in the glass composition, with the result that its devitrification resistance deteriorates, and its viscosity at high temperature lowers excessively, with the result that it is difficult to keep its high liquidus viscosity. Thus, the upper limit range of ZnO is suitably 8% or less, 4% or less, 2% or less, 1% or less, 0.5% or less, 0.1% or less, particularly suitably 0.01% or less.

The content of $La_2O_3+Nb_2O_5+Gd_2O_3$ is preferably 0 to 10%. When the content of $La_2O_3+Nb_2O_5+Gd_2O_3$ increases in glass, its refractive index nd tends to be higher. However, when the content of $La_2O_3+Nb_2O_5+Gd_2O_3$ is more than 10% in glass, the balance among the components of the glass is lost in the glass composition, resulting in the deterioration of its devitrification resistance, and the material cost of the glass rises, possibly resulting in the surge of its production cost. Inexpensive glass is required particularly in applications such as lighting devices, and hence an increase in material cost is not preferred. Thus, the lower limit range of $La_2O_3+Nb_2O_5+Gd_2O_3$ is suitably 9% or less, 8% or less, 5% or less, 3% or less, 2% or less, 1% or less, 0.5% or less, particularly suitably 0.1% or less.

The content of $Gd_2O_3$ is preferably 0 to 10%. $Gd_2O_3$ is a component that increases the refractive index of glass. However, when the content of $Gd_2O_3$ increases in glass, its density and thermal expansion coefficient become too high, the balance among the components of the glass is lost in the glass composition, with the result that its devitrification resistance deteriorates, and its viscosity at high temperature lowers excessively, with the result that it is difficult to keep its high liquidus viscosity. Thus, the upper limit range of $Gd_2O_3$ is suitably 8% or less, 4% or less, 2% or less, 1% or less, 0.5% or less, 0.1% or less, particularly suitably 0.01% or less.

The content of $Li_2O+Na_2O+K_2O$ is preferably 0 to 15%. $Li_2O+Na_2O+K_2O$ is a component that reduces the viscosity of glass and is a component that adjusts its thermal expansion coefficient. However, when $Li_2O+Na_2O+K_2O$ is added in a large amount in glass, its viscosity lowers excessively, with the result that it is difficult to keep its high liquidus viscosity. Thus, the upper limit range of $Li_2O+Na_2O+K_2O$ is suitably 10% or less, 5% or less, 2% or less, 1.5% or less, 1% or less, 0.5% or less, particularly suitably 0.1% or less.

As a fining agent, one kind or two or more kinds selected from the group consisting of $As_2O_3$, $Sb_2O_3$, $CeO_2$, $SnO_2$, F, Cl, and $SO_3$ may be added in an amount of 0 to 3%. Note that it is preferred to use $As_2O_3$, $Sb_2O_3$, and F, in particular, $As_2O_3$ and $Sb_2O_3$ in an amount as small as possible from the environmental viewpoint, and each of the contents thereof is preferably less than 0.1%. In consideration of the above-mentioned points, $SnO_2$, $SO_3$, and Cl are each preferably used as the fining agent. In particular, the content of $SnO_2$ is preferably 0 to 1%, 0.01 to 0.5%, particularly preferably 0.05 to 0.4%. Further, the content of $SnO_2+SO_3+Cl$ is preferably 0 to 1%, 0.001 to 1%, 0.01 to 0.5%, particularly preferably 0.01 to 0.3%. Herein, the "$SnO_2+SO_3+Cl$" refers to the total amount of $SnO_2$, $SO_3$, and Cl.

PbO is a component that decreases the viscosity of glass at high temperature, but is preferably used in an amount as small as possible from the environmental viewpoint. The content of PbO is preferably 0.5% or less, more preferably less than 1,000 ppm (by mass).

$Bi_2O_3$ is a component that decreases the viscosity of glass at high temperature, but is preferably used in an amount as small as possible from the environmental viewpoint. The content of $Bi_2O_3$ is preferably 0.5% or less, more preferably less than 1,000 ppm (by mass).

It is possible, as a matter of course, to construct suitable ranges of the composition of glass by combining each suitable content range of each component. Out of those suitable ranges, the particularly suitable ranges of the composition of glass are the following ranges, from the viewpoints of the refractive index nd of glass, its denitrification resistance, its production cost, and the like.

(1) A glass, comprising, as a glass composition in terms of mass %, 20 to 50% of $SiO_2$, 0 to 8% of $B_2O_3$, 0 to 10% of CaO, 0.01 to 35% of SrO, 0 to 30% of BaO, 0 to 4% of ZnO, 0.001 to 20% of $ZrO_2+TiO_2$, 0 to 3% of $La_2O_3+Nb_2O_5$, and 0 to 1% of $Li_2O+Na_2O+K_2O$, and having a mass ratio of BaO/SrO of 0 to 20, a mass ratio of $SiO_2$/SrO of 1 to 15, and a mass ratio of (MgO+CaO)/SrO of 0 to 10.

(2) A glass, comprising, as a glass composition in terms of mass %, 35 to 50% of $SiO_2$, 0 to 5% of $B_2O_3$, 0 to 9% of CaO, 1 to 35% of SrO, 0 to 29% of BaO, 0 to 3% of ZnO, 1 to 15% of $ZrO_2+TiO_2$, 0 to 0.1% of $La_2O_3+Nb_2O_5$, and 0 to 0.1% of $Li_2O+Na_2O+K_2O$, and having a mass ratio of BaO/SrO of 0 to 10, a mass ratio of $SiO_2$/SrO of 1 to 10, and a mass ratio of (MgO+CaO)/SrO of 0 to 5.

(3) A glass, comprising, as a glass composition in terms of mass %, 35 to 50% of $SiO_2$, 0 to 3% of $B_2O_3$, 0 to 9% of CaO, 2 to 20% of SrO, 0 to 28% of BaO, 0 to 1% of ZnO, 3 to 15% of $ZrO_2+TiO_2$, 0 to 0.1% of $La_2O_3+Nb_2O_5$, and 0 to 0.1% of $Li_2O+Na_2O+K_2O$, and having a mass ratio of BaO/SrO of 0 to 8, a mass ratio of $SiO_2$/SrO of 2 to 10, and a mass ratio of (MgO+CaO)/SrO of 0 to 3.

(4) A glass, comprising, as a glass composition in terms of mass %, 35 to 50% of $SiO_2$, 0 to 1% of $B_2O_3$, 0 to 8.5% of CaO, 4 to 15% of SrO, 0 to 28% of BaO, 0 to 0.1% of ZnO, 6 to 15% of $ZrO_2+TiO_2$, 0 to 0.1% of $La_2O_3+Nb_2O_5$, and 0 to 0.1% of $Li_2O+Na_2O+K_2O$, and having a mass ratio of BaO/SrO of 0 to 8, a mass ratio of $SiO_2$/SrO of 2 to 10, and a mass ratio of (MgO+CaO)/SrO of 0 to 3.

(5) A glass, comprising, as a glass composition in terms of mass %, 35 to 55% of $SiO_2$, 0 to 8% of $B_2O_3$, 0.001 to 35% of SrO, 0 to 12% of ZnO, 0.001 to 30% of $ZrO_2+TiO_2$, 0 to 5% of $La_2O_3+Nb_2O_5$, and 0 to 10% of $Li_2O+Na_2O+K_2O$, and having a mass ratio of BaO/SrO of 0 to 20, a mass ratio of $SiO_2$/SrO of 0.1 to 20, and a mass ratio of (MgO+CaO)/SrO of 0 to 20.

(6) A glass, comprising, as a glass composition in terms of mass %, 35 to 55% of $SiO_2$, 0 to 5% of $B_2O_3$, 0 to 5% of MgO, 0 to 10% of $ZrO_2$, 0 to 2% of $Li_2O+Na_2O+K_2O$, 0.1 to 20% of SrO, 0 to 30% of BaO, 0.001 to 15% of $TiO_2$, and 0 to 9% of $La_2O_3+Nb_2O_5+Gd_2O_3$, and having a mass ratio of $(La_2O_3+Nb_2O_5)/(ZrO_2+TiO_2)$ of 0 to 5, and a mass ratio of BaO/SrO of 0 to 10.

(7) A glass, comprising, as a glass composition in terms of mass %, 35 to 55% of $SiO_2$, 0 to 5% of $B_2O_3$, 0 to 5% of MgO, 0 to 10% of $ZrO_2$, 0 to 2% of $Li_2O+Na_2O+K_2O$, 0.1 to 20% of SrO, 0 to 30% of BaO, 0.001 to 15% of $TiO_2$, and 0 to 9% of $La_2O_3+Nb_2O_5+Gd_2O_3$, and having a mass ratio of $(La_2O_3+Nb_2O_5)/(ZrO_2+TiO_2)$ of 0 to 5, a mass ratio of BaO/SrO of 0 to 10, a mass ratio of $SiO_2$/SrO of 0.1 to 10, and a mass ratio of (MgO+CaO)/SrO of 0 to 2.

The high refractive index glass of the first embodiment has a refractive index nd of 1.55 or more, more preferably 1.58 or more, 1.6 or more, 1.63 or more, 1.65 or more, particularly preferably 1.66 or more. When the refractive index nd is less than 1.55, the reflectance at the interface between an ITO film and the glass becomes higher, and hence light cannot be extracted efficiently. On the other hand, when the refractive index nd is more than 2.3, the reflectance at the interface between air and the glass becomes higher, and hence it is difficult to enhance light extraction efficiency even if the surface of the glass is subjected to roughening treatment. Thus, the refractive index nd is preferably 2.3 or less, 2.2 or less, 2.1 or less, 2.0 or less, 1.9 or less, particularly preferably 1.75 or less.

The high refractive index glass of the first embodiment has a liquidus temperature of preferably 1,200° C. or less, 1,150° C. or less, 1,130° C. or less, 1,110° C. or less, 1,090° C. or less, 1,070° C. or less, particularly preferably 1,050° C. or less. Further, the liquidus viscosity is preferably $10^{3.0}$ dPa·s or more, $10^{3.5}$ dPa·s or more, $10^{3.8}$ dPa·s or more, $10^{4.0}$ dPa·s or more, $10^{4.1}$ dPa·s or more, $10^{4.2}$ dPa·s or more, particularly preferably $10^{4.3}$ dPa·s or more. With this, it becomes difficult for the glass to denitrify at the time of forming, and it becomes easier to form the glass into a glass sheet by a float method.

The high refractive index glass of the first embodiment preferably has a sheet shape, and has a thickness of preferably 1.5 mm or less, 1.3 mm or less, 1.1 mm or less, 0.8 mm or less, 0.6 mm or less, 0.5 mm or less, 0.3 mm or less, particularly preferably 0.2 mm or less. As the thickness of the glass becomes smaller, its flexibility increases, and design diversities of a lighting device can be easily increased. However, when the thickness of a glass sheet becomes extremely small, the glass sheet is liable to be damaged. Thus, the thickness of a glass sheet is preferably 10 μm or more, particularly preferably 30 μm or more.

The high refractive index glass of the first embodiment is preferably formed by a float method. With this, it is possible to produce unpolished glass sheets with good surface quality at low cost in large numbers.

A method other than the float method, such as a down-draw method (e.g., an overflow down-draw method, a slot down method, or a re-draw method) or a roll-out method, may also be adopted for forming glass into a glass sheet.

The high refractive index glass of the first embodiment is preferably subjected to roughening treatment on one of its surfaces by HF etching, sandblasting, or the like. The surface roughness Ra of the roughening treated surface is preferably 10 Å or more, 20 Å or more, 30 Å or more, particularly preferably 50 Å or more. When the roughening treated surface is arranged on the side to be brought into contact with air of an OLED lighting device or the like, because the roughening treated surface has a non-reflective structure, light produced in an organic light-emitting layer does not easily return into the organic light-emitting layer. As a result, light extraction efficiency can be enhanced. Further, irregularities may be provided in a surface of glass by thermal processing such as re-pressing. With this, a precise reflective structure can be formed in the surface of the glass. The interval and depth of the irregularities are recommended to be adjusted in consideration of the refractive index nd of the glass. Further, a resin film with irregularities may be attached on a surface of glass.

When atmospheric plasma processing is adopted, while the surface condition of one surface of a glass sheet is maintained, the other surface of the glass sheet can be uniformly subjected to roughening treatment. Further, it is preferred to use a gas containing F (such as $SF_6$ or $CF_4$) as a source for the atmospheric plasma processing. With this, a plasma containing an HF-based gas is generated, and hence the efficiency of the roughening treatment is enhanced.

Note that, when a non-reflective structure is formed on a surface of glass at the time of forming, the non-reflective structure can provide the same effect as that of roughening treatment even if the roughening treatment is not carried out.

The high refractive index glass of the first embodiment has a density of preferably 5.0 g/cm³ or less, 4.8 g/cm³ or less, 4.5 g/cm³ or less, 4.3 g/cm³ or less, 3.7 g/cm³ or less, particularly preferably 3.5 g/cm³ or less. With this, the weight of the glass is reduced, and hence the weight of a device can be reduced. Note that the "density" can be measured by a well-known Archimedes method.

The high refractive index glass of the first embodiment has a thermal expansion coefficient of preferably $30\times10^{-7}$ to $100\times10^{-7}$/° C., $40\times10^{-7}$ to $90\times10^{-7}$/° C., $60\times10^{-7}$ to $85\times10^{-7}$/° C., $65\times10^{-7}$ to $80\times10^{-7}$/° C., $68\times10^{-7}$ to $78\times10^{-7}$/° C., particularly preferably $70\times10^{-7}$ to $78\times10^{-7}$/° C. In recent years, the development of a glass sheet having flexibility has been required in order to use the glass sheet in an OLED lighting device, an OLED device, and a dye-sensitized solar cell, from the viewpoint of improving their design elements. For enhancing the flexibility of a glass sheet, the thickness of the glass sheet needs to be smaller. In this case, when the thermal expansion coefficient of the glass sheet does not match to that of a transparent conductive film such as an ITO film or an FTO film, the glass sheet is liable to warp. Further, when an OLED display using an oxide TFT is manufactured, if the thermal expansion coefficient of the oxide TFT does not match to that of a glass sheet, the glass sheet may have warpage or the film of the oxide TFT may have cracks. Thus, when the thermal expansion coefficient is controlled in any of the above-mentioned ranges, such a situation as described above can be easily prevented. Herein, the "thermal expansion coefficient" refers to an average value in the temperature range of 30 to 380° C., and can be measured with, for example, a dilatometer.

The high refractive index glass of the first embodiment has a strain point of preferably 630° C. or more, 650° C. or more, 670° C. or more, 690° C. or more, particularly preferably 700° C. or more. With this, the glass resists heat shrinkage even if high-temperature heat treatment is performed during the production step of a device. Particularly when an OLED display is manufactured by using an oxide TFT or the like, heat treatment at about 600° C. is necessary for stabilizing the quality of the oxide TFT. When the strain point is restricted as described above, the heat shrinkage of the glass can be reduced in the heat treatment.

The high refractive index glass of the first embodiment has a temperature at $10^{2.5}$ dPa·s of preferably 1,400° C. or less, 1,350° C. or less, 1,300° C. or less, 1,250° C. or less, particularly preferably 1,200° C. or less. With this, the meltability of the high refractive index glass improves. Hence, glass having excellent bubble quality can be easily produced, and the production efficiency of a glass sheet improves.

The high refractive index glass of the first embodiment has a temperature at $10^{4.0}$ dPa·s of preferably 1,250° C. or less, 1,200° C. or less, 1,150° C. or less, 1,110° C. or less, particularly preferably 1,060° C. or less. With this, when the high refractive index glass is formed into a glass sheet by a float method, the forming temperature thereof can be lowered. Consequently, a low-temperature operation can be carried out, a refractory used in a forming part has a longer service life, and the production cost of the glass sheet is easily reduced.

A method of producing the high refractive index glass of the first embodiment is exemplified as follows. First, a glass batch is manufactured by blending glass materials so that a desired glass composition is achieved. Next, the glass batch is melted and fined, and the resultant molten glass is then formed into a desired shape. Subsequently, the resultant is subjected to annealing treatment as required and processed into a desired shape.

Note that a glass sheet for a lighting device according to an embodiment of the first invention comprises, as a glass composition in terms of mass %, 0.1 to 60% of $SiO_2$, 0 to 10% of $B_2O_3$, 0.001 to 35% of SrO, 0 to 40% of BaO, 0.001 to 30% of $ZrO_2+TiO_2$, and 0 to 10% of $La_2O_3+Nb_2O_5$, and has a refractive index nd of 1.55 to 2.3. Further, a glass sheet for an OLED lighting device according to an embodiment of the first invention comprises, as a glass composition in terms of mass %, 0.1 to 60% of $SiO_2$, 0 to 10% of $B_2O_3$, 0.001 to 35% of SrO, 0 to 40% of BaO, 0.001 to 30% of $ZrO_2+TiO_2$, and 0 to 10% of $La_2O_3+Nb_2O_5$, and has a refractive index nd of 1.55 to 2.3. In addition, a glass sheet for an OLED display according to an embodiment of the first invention comprises, as a glass composition in terms of mass %, 0.1 to 60% of $SiO_2$, 0 to 10% of $B_2O_3$, 0.001 to 35% of SrO, 0 to 40% of BaO, 0.001 to 30% of $ZrO_2+TiO_2$, and 0 to 10% of $La_2O_3+Nb_2O_5$, and has a refractive index nd of 1.55 to 2.3. The glass sheet for a lighting device, the glass sheet for an OLED lighting device, and the glass sheet for an OLED display each have substantially the same technical features as those of the high refractive index glass described in the first embodiment above, and hence the detailed description thereof is omitted here for convenience sake.

Example 1

Hereinafter, examples of the first invention are described in detail. Note that the following examples are merely for illustrative purposes. The first invention is by no means limited to the following examples.

Tables 1 to 4 show examples of the first invention (Sample Nos. 1 to 19).

TABLE 1

| | | Example | | | | |
|---|---|---|---|---|---|---|
| | | No. 1 | No. 2 | No. 3 | No. 4 | No. 5 |
| Glass composition [mass %] | $SiO_2$ | 42.0 | 42.0 | 45.0 | 45.0 | 45.0 |
| | $Al_2O_3$ | 5.0 | 5.0 | 5.0 | 5.0 | 5.0 |
| | $B_2O_3$ | — | 3.0 | — | — | 6.0 |
| | CaO | 5.9 | 5.9 | 5.9 | 5.9 | 5.9 |
| | SrO | 7.9 | 4.9 | 7.9 | 10.9 | 4.9 |
| | BaO | 26.2 | 26.2 | 26.2 | 26.2 | 26.2 |
| | $ZrO_2$ | 3.0 | 3.0 | 3.0 | 3.0 | 3.0 |
| | $TiO_2$ | 10.0 | 10.0 | 7.0 | 4.0 | 4.0 |
| $ZrO_2+TiO_2$ | | 13.0 | 13.0 | 10.0 | 7.0 | 7.0 |
| $La_2O_3+Nb_2O_5$ | | 0 | 0 | 0 | 0 | 0 |
| $SiO_2$/SrO | | 5.3 | 8.6 | 5.7 | 4.1 | 9.2 |
| BaO/SrO | | 3.3 | 5.3 | 3.3 | 2.4 | 5.3 |
| (MgO + CaO)/SrO | | 0.7 | 1.2 | 0.7 | 0.5 | 1.2 |
| Density [g/cm³] | | 3.39 | 3.29 | 3.33 | 3.36 | 3.27 |
| Thermal expansion coefficient [×$10^{-7}$/° C.] 30 to 380° C. | | 72 | 69 | 71 | 74 | 68 |
| Ps [° C.] | | 700 | 667 | 698 | 692 | 646 |
| Ta [° C.] | | 741 | 706 | 740 | 736 | 686 |
| Ts [° C.] | | 885 | 852 | 894 | 895 | 840 |
| $10^4$ dPa·s [° C.] | | 1,068 | 1,040 | 1,099 | 1,105 | 1,052 |
| $10^3$ dPa·s [° C.] | | 1,165 | 1,137 | 1,203 | 1,212 | 1,162 |
| $10^{2.5}$ dPa·s [° C.] | | 1,229 | 1,204 | 1,273 | 1,284 | 1,236 |
| TL [° C.] | | 1,110 | 1,075 | 1,088 | 1,083 | 1,087 |
| $\log_{10}\eta$TL [dPa·s] | | 3.5 | 3.6 | 4.1 | 4.3 | 3.6 |
| Refractive index nd $\lambda$ = 587.6 nm | | 1.67 | 1.66 | 1.64 | 1.63 | 1.61 |

TABLE 2

| | | Example | | | |
|---|---|---|---|---|---|
| | | No. 6 | No. 7 | No. 8 | No. 9 |
| Glass composition [mass %] | $SiO_2$ | 42.0 | 45.0 | 39.0 | 42.0 |
| | $Al_2O_3$ | 5.0 | 5.0 | 5.0 | 5.0 |
| | $B_2O_3$ | — | — | 4.0 | — |
| | CaO | 5.9 | 5.9 | 6.0 | 6.0 |
| | SrO | 7.9 | 4.9 | 10.0 | 10.0 |
| | BaO | 26.2 | 29.2 | 28.0 | 28.0 |
| | $ZrO_2$ | 6.0 | 3.0 | 5.0 | 5.0 |
| | $TiO_2$ | 7.0 | 7.0 | 3.0 | 4.0 |
| $ZrO_2 + TiO_2$ | | 13.0 | 10.0 | 8.0 | 9.0 |
| $La_2O_3 + Nb_2O_5$ | | 0 | 0 | 0 | 0 |
| $SiO_2/SrO$ | | 5.3 | 9.2 | 3.9 | 4.2 |
| BaO/SrO | | 3.3 | 6.0 | 2.8 | 2.8 |
| (MgO + CaO)/SrO | | 0.7 | 1.2 | 0.6 | 0.6 |
| Density [g/cm³] | | 3.41 | 3.32 | 3.44 | 3.45 |

TABLE 2-continued

| | Example | | | |
|---|---|---|---|---|
| | No. 6 | No. 7 | No. 8 | No. 9 |
| Thermal expansion coefficient [×10⁻⁷/° C.] 30 to 380° C. | 72 | 70 | 76 | 76 |
| Ps [° C.] | 712 | 696 | 658 | 705 |
| Ta [° C.] | 755 | 738 | 698 | 748 |
| Ts [° C.] | 907 | 895 | 848 | 904 |
| $10^4$ dPa · s [° C.] | 1,104 | 1,101 | 1,040 | 1,104 |
| $10^3$ dPa · s [° C.] | 1,202 | 1,208 | 1,134 | 1,203 |
| $10^{2.5}$ dPa · s [° C.] | 1,268 | 1,280 | 1,196 | 1,268 |
| TL [° C.] | 1,090 | 1,100 | 1,045 | 1,100 |
| $\log_{10} \eta TL$ [dPa · s] | 4.2 | 4.0 | 3.9 | 4.1 |
| Refractive index nd $\lambda = 587.6$ nm | 1.66 | 1.64 | 1.64 | 1.64 |

TABLE 3

| | | Example | | | | |
|---|---|---|---|---|---|---|
| | | No. 10 | No. 11 | No. 12 | No. 13 | No. 14 |
| Glass composition [mass %] | $SiO_2$ | 50.0 | 40.0 | 47.5 | 42.5 | 45.0 |
| | $Al_2O_3$ | — | 10.0 | 2.5 | 7.5 | 5.0 |
| | CaO | 5.9 | 5.9 | 5.9 | 5.9 | 7.9 |
| | SrO | 10.9 | 10.9 | 10.9 | 10.9 | 10.9 |
| | BaO | 26.2 | 26.2 | 26.2 | 26.2 | 24.2 |
| | $ZrO_2$ | 3.0 | 3.0 | 3.0 | 3.0 | 3.0 |
| | $TiO_2$ | 4.0 | 4.0 | 4.0 | 4.0 | 4.0 |
| $ZrO_2 + TiO_2$ | | 7.0 | 7.0 | 7.0 | 7.0 | 7.0 |
| $La_2O_3 + Nb_2O_5$ | | 1.0 | 2.0 | 3.0 | 4.0 | 0 |
| $SiO_2/SrO$ | | 4.6 | 3.7 | 4.4 | 3.9 | 4.1 |
| BaO/SrO | | 2.4 | 2.4 | 2.4 | 2.4 | 2.2 |
| (MgO + CaO)/SrO | | 0.5 | 0.5 | 0.5 | 0.5 | 0.7 |
| Density [g/cm³] | | 3.33 | 3.39 | 3.37 | 3.38 | 3.35 |
| Thermal expansion coefficient [×10⁻⁷/° C.] 30 to 380° C. | | 75 | 73 | 74 | 74 | 76 |
| Ps [° C.] | | 682 | 710 | 702 | 669 | 691 |
| Ta [° C.] | | 724 | 754 | 746 | 711 | 735 |
| Ts [° C.] | | 881 | 913 | 904 | 865 | 892 |
| $10^4$ dPa · s [° C.] | | 1,098 | 1,119 | 1,112 | 1,066 | 1,096 |
| $10^3$ dPa · s [° C.] | | 1,204 | 1,223 | 1,218 | 1,166 | 1,199 |
| $10^{2.5}$ dPa · s [° C.] | | 1,276 | 1,292 | 1,288 | 1,232 | 1,269 |
| TL [° C.] | | Not evaluated | Not evaluated | 1,169 | 1,083 | Not evaluated |
| $\log_{10} \eta TL$ [dPa · s] | | Not evaluated | Not evaluated | 3.4 | 3.8 | Not evaluated |
| Refractive index nd $\lambda = 587.6$ nm | | 1.62 | 1.63 | 1.63 | 1.64 | 1.63 |

TABLE 4

| | | Example | | | | |
|---|---|---|---|---|---|---|
| | | No. 15 | No. 16 | No. 17 | No. 18 | No. 19 |
| Glass composition [mass %] | $SiO_2$ | 45.0 | 45.0 | 45.0 | 45.0 | 45.0 |
| | $Al_2O_3$ | 5.0 | 5.0 | 5.0 | 5.0 | 5.0 |
| | CaO | 3.9 | 3.9 | 7.9 | 5.9 | 5.9 |
| | SrO | 10.9 | 10.9 | 10.9 | 10.9 | 10.9 |
| | BaO | 28.2 | 26.2 | 26.2 | 24.2 | 28.2 |
| | $ZrO_2$ | 3.0 | 5.0 | 1.0 | 5.0 | 1.0 |
| | $TiO_2$ | 4.0 | 4.0 | 4.0 | 4.0 | 4.0 |
| $ZrO_2 + TiO_2$ | | 7.0 | 9.0 | 5.0 | 9.0 | 5.0 |
| $La_2O_3 + Nb_2O_5$ | | 0 | 0 | 0 | 0 | 0 |
| $SiO_2/SrO$ | | 4.1 | 4.1 | 4.1 | 4.1 | 4.1 |
| BaO/SrO | | 2.6 | 2.4 | 2.4 | 2.2 | 2.6 |
| (MgO + CaO)/SrO | | 0.4 | 0.4 | 0.7 | 0.5 | 0.5 |
| Density [g/cm³] | | 3.37 | 3.36 | 3.36 | 3.35 | 3.37 |
| Thermal expansion coefficient [×10⁻⁷/° C.] 30 to 380° C. | | 72 | 70 | 78 | 71 | 77 |

TABLE 4-continued

| | Example | | | | |
|---|---|---|---|---|---|
| | No. 15 | No. 16 | No. 17 | No. 18 | No. 19 |
| Ps [° C.] | 693 | 701 | 683 | 700 | 684 |
| Ta [° C.] | 737 | 746 | 726 | 745 | 727 |
| Ts [° C.] | 898 | 909 | 881 | 906 | 884 |
| $10^4$ dPa·s [° C.] | 1,114 | 1,126 | 1,084 | 1,117 | 1,093 |
| $10^3$ dPa·s [° C.] | 1,225 | 1,238 | 1,186 | 1,225 | 1,199 |
| $10^{2.5}$ dPa·s [° C.] | 1,299 | 1,313 | 1,255 | 1,298 | 1,270 |
| TL [° C.] | Not evaluated | Not evaluated | Not evaluated | Not evaluated | Not evaluated |
| $\log_{10}\eta$TL [dPa·s] | Not evaluated | Not evaluated | Not evaluated | Not evaluated | Not evaluated |
| Refractive index nd $\lambda$ = 587.6 nm | 1.63 | 1.63 | 1.63 | 1.64 | 1.63 |

First, glass materials were blended so that each glass composition described in Tables 1 to 4 was achieved. After that, the resultant glass batch was fed into a glass melting furnace and melted at 1,500 to 1,600° C. for 4 hours. Next, the resultant molten glass was poured on a carbon sheet to be formed into a glass sheet, followed by predetermined annealing treatment. Finally, the resultant glass sheet was evaluated for its various characteristics.

The density is a value obtained by measurement using a well-known Archimedes method.

The thermal expansion coefficient is a value obtained by measurement of an average thermal expansion coefficient at 30 to 380° C. with a dilatometer. A cylindrical sample (having end surfaces subjected to R processing) having a size of 5 mm in diameter by 20 mm in length was used as a measurement sample.

The strain point Ps is a value obtained by measurement based on a method as described in ASTM C336-71. Note that, as the strain point Ps becomes higher, the heat resistance becomes higher.

The annealing point Ta and the softening point Ts are values obtained by measurement based on a method as described in ASTM C338-93.

The temperatures at viscosities of $10^{4.0}$ dPa·s, $10^{3.0}$ dPa·s, and $10^{2.5}$ dPa·s are values obtained by measurement using a platinum sphere pull up method. Note that, as each of the temperatures becomes lower, the meltability becomes more excellent.

The liquidus temperature TL is a value obtained by measuring a temperature at which crystals of glass deposit when glass powder that has passed through a standard 30-mesh sieve (500 μm) and remained on a 50-mesh sieve (300 μm) is placed in a platinum boat and kept in a gradient heating furnace for 24 hours. Further, the liquidus viscosity $\log_{10}\eta$TL is a value obtained by measuring the viscosity of glass at its liquidus temperature by a platinum sphere pull up method. Note that, as the liquidus viscosity becomes higher and the liquidus temperature becomes lower, each of the denitrification resistance and the formability becomes more excellent.

The refractive index nd is a value obtained by producing samples having a rectangular parallelepiped shape of 25 mm by 25 mm by about 3 mm, then subjecting the samples to annealing treatment at a cooling rate of 0.1° C./min in the temperature range from (annealing point Ta+30° C.) to (strain point Ps-50° C.), and subsequently measuring the refractive index nd with a refractometer KPR-2000 manufactured by Shimadzu Corporation in a state in which an immersion liquid having a refractive index nd matching to that of the samples is immersed between two glass samples.

Example 2

Glass materials were blended so that the glass composition described in Sample No. 3 was achieved, and then the resultant glass batch was loaded into a continuous kiln and melted at a temperature of 1,500 to 1,600° C. Subsequently, the resultant molten glass was formed into a glass sheet having a thickness of 0.5 mm by a float method.

Glass materials were blended so that the glass composition described in Sample No. 4 was achieved, and then the resultant glass batch was loaded into a continuous kiln and melted at a temperature of 1,500 to 1,600° C. Subsequently, the resultant molten glass was formed into a glass sheet having a thickness of 0.5 mm by a float method.

Glass materials were blended so that the glass composition described in Sample No. 6 was achieved, and then the resultant glass batch was loaded into a continuous kiln and melted at a temperature of 1,500 to 1,600° C. Subsequently, the resultant molten glass was formed into a glass sheet having a thickness of 0.5 mm by a float method.

Second Embodiment

A high refractive index glass according to an embodiment of the second invention (hereinafter, referred to as second embodiment) comprises, as a glass composition in terms of mass %, 30 to 60% of $SiO_2$, 0 to 15% of $B_2O_3$, 0 to 15% of $Al_2O_3$, 0 to 10% of $Li_2O$, 0 to 10% of $Na_2O$, 0 to 10% of $K_2O$, 20 to 60% of MgO+CaO+SrO+BaO+ZnO, 0.0001 to 20% of $TiO_2$, 0 to 20% of $ZrO_2$, and 0 to 10% of $La_2O_3+Nb_2O_5$. The reasons why the content range of each component has been restricted as mentioned above are described below. Note that, in the description of the content range of each component, "%" refers to "mass %" unless otherwise specified.

The content of $SiO_2$ is 30 to 60%. When the content of $SiO_2$ increases in glass, its meltability and formability are liable to deteriorate, and its refractive index nd is liable to lower. Thus, the upper limit of the content of $SiO_2$ is 60% or less, preferably 50% or less, 48% or less, 45% or less, particularly preferably 43% or less. On the other hand, when the content of $SiO_2$ decreases in glass, its network structure is not easily formed, resulting in difficulty in vitrification, the viscosity of the glass becomes too low, with the result that it is difficult for the glass to keep a high liquidus viscosity, and its acid resistance is liable to lower. Thus, the lower limit of the content of $SiO_2$ is 30% or more, preferably 35% or more, 38% or more, particularly preferably 40% or more.

The content of $B_2O_3$ is 0 to 15%. When the content of $B_2O_3$ increases in glass, its Young's modulus is liable to lower and its strain point is liable to lower. Moreover, the balance among the components of the glass is impaired in the glass composition, with the result that its denitrification resistance is liable to deteriorate and its acid resistance is liable to deteriorate. Thus, the upper limit of the content of $B_2O_3$ is 15% or less, preferably 10% or less, 8% or less, particularly preferably 6% or less. On the other hand, if the content of the $B_2O_3$ is small, the liquidus viscosity of the glass easily lowers. Thus, the lower limit content of $B_2O_3$ is suitably 0.1% or more, 0.5% or more, 1% or more, 1.5% or more, 2% or more, 3% or more, particularly suitably 4% or more.

The mass ratio of $B_2O_3/SiO_2$ is preferably 0 to 1. When the mass ratio of $B_2O_3/SiO_2$ increases in glass, it becomes difficult for the glass to keep a high liquidus viscosity and its chemical resistance is liable to deteriorate. Thus, the upper limit range of the mass ratio of $B_2O_3/SiO_2$ is suitably 1 or less, 0.5 or less, 0.2 or less, 0.15 or less, particularly suitably 0.13 or less. On the other hand, when the mass ratio of $B_2O_3/SiO_2$ decreases in glass, the balance among the components of the glass is impaired in the glass composition, with the result that its devitrification resistance is liable to deteriorate. Thus, the lower limit range of the mass ratio of $B_2O_3/SiO_2$ is suitably 0.01 or more, 0.02 or more, 0.03 or more, 0.04 or more, 0.05 or more, particularly suitably 0.10 or more.

The content of $Al_2O_3$ is 0 to 15%. When the content of $Al_2O_3$ is too large in glass, the balance among the components of the glass is impaired in the glass composition, with the results that its devitrification resistance is liable to deteriorate and its acid resistance is liable to deteriorate. Thus, the upper limit of the content of $Al_2O_3$ is 15% or less, preferably 10% or less, 8% or less, particularly preferably 6% or less. On the other hand, when the content of $Al_2O_3$ decreases in glass, its viscosity becomes too low, with the result that it is difficult for the glass to keep a high liquidus viscosity. Thus, the lower limit content of $Al_2O_3$ is suitably 0.5% or more, 1% or more, 2% or more, particularly suitably 4% or more.

The content of $Li_2O$ is 0 to 10%. When the content of $Li_2O$ increases in glass, its liquidus viscosity is liable to lower, its strain point is liable to lower, and the elution of the alkali component in an etching step with acid easily causes the glass to be cloudy. Thus, the upper limit of the content of $Li_2O$ is 10% or less, preferably 8% or less, 5% or less, 4% or less, 3% or less, less than 2%, 1% or less, particularly preferably less than 1%, and it is desirable that glass be substantially free of $Li_2O$. Herein, the phrase "substantially free of $Li_2O$" refers to the case where the content of $Li_2O$ in a glass composition is less than 1,000 ppm (by mass).

The content of $Na_2O$ is 0 to 10%. When the content of $Na_2O$ increases in glass, its liquidus viscosity is liable to lower, its strain point is liable to lower, and the elution of the alkali component in an etching step with acid easily causes the glass to be cloudy. Thus, the upper limit of the content of $Na_2O$ is 10% or less, preferably 8% or less, 5% or less, 4% or less, 3% or less, less than 2%, 1% or less, particularly preferably less than 1%, and it is desirable that glass be substantially free of $Na_2O$. Herein, the phrase "substantially free of $Na_2O$" refers to the case where the content of $Na_2O$ in a glass composition is less than 1,000 ppm (by mass).

The content of $K_2O$ is 0 to 10%. When the content of $K_2O$ increases in glass, its liquidus viscosity is liable to lower, its strain point is liable to lower, and the elution of the alkali component in an etching step with acid easily causes the glass to be cloudy. Thus, the upper limit of the content of $K_2O$ is 10% or less, preferably 8% or less, 5% or less, 4% or less, 3% or less, less than 2%, 1% or less, particularly preferably less than 1%, and it is desirable that glass be substantially free of $K_2O$. Herein, the phrase "substantially free of $K_2O$" refers to the case where the content of $K_2O$ in a glass composition is less than 1,000 ppm (by mass).

The content of $Li_2O+Na_2O+K_2O$ is 0 to 10%. When the content of $Li_2O+Na_2O+K_2O$ increases in glass, its liquidus viscosity is liable to lower, its strain point is liable to lower, and the elution of the alkali component in an etching step with acid easily causes the glass to be cloudy. Thus, the upper limit of the content of $Li_2O+Na_2O+K_2O$ is 10% or less, 8% or less, 5% or less, 4% or less, 3% or less, 2% or less, 1% or less, particularly less than 1%, and it is desirable that glass be substantially free of $Li_2O+Na_2O+K_2O$. Herein, the phrase "substantially free of $Li_2O+Na_2O+K_2O$" refers to the case where the content of $Li_2O+Na_2O+K_2O$ in a glass composition is less than 1,000 ppm (by mass).

The content of MgO is preferably 0 to 20%. MgO is a component that increases the refractive index nd of glass, its Young's modulus, and its strain point and is a component that decreases its viscosity at high temperature. However, when MgO is contained in a large amount in glass, its liquidus temperature rises, with the result that its denitrification resistance may deteriorate and its density and thermal expansion coefficient may become too high. Thus, the upper limit content of MgO is suitably 20% or less, 10% or less, particularly suitably 6% or less. On the other hand, when the content of MgO decreases in glass, its meltability deteriorates, its Young's modulus lowers, and its refractive index nd is liable to lower. Thus, the lower limit content of MgO is suitably 0.1% or more, 0.5% or more, 1% or more, 1.5% or more, 2% or more, particularly suitably 3% or more.

The content of CaO is preferably 0 to 15%. When the content of CaO increases in glass, its density and thermal expansion coefficient are liable to be higher, and the balance among the components of the glass is impaired in the glass composition, with the result that its devitrification resistance is liable to deteriorate. Thus, the upper limit content of CaO is suitably 15% or less, 13% or less, 11% or less, 9.5% or less, particularly suitably 8% or less. On the other hand, when the content of CaO decreases in glass, its meltability deteriorates, its Young's modulus lowers, and its refractive index nd is liable to lower. Thus, the lower limit content of CaO is suitably 0.5% or more, 1% or more, particularly suitably 2% or more.

The content of SrO is preferably 0 to 25%. When the content of SrO increases in glass, its refractive index nd, density, and thermal expansion coefficient are liable to be higher, and the balance among the components of the glass is impaired in the glass composition, with the result that its devitrification resistance is liable to deteriorate. Thus, the upper limit content of SrO is suitably 25% or less, 18% or less, 14% or less, particularly suitably 12% or less. On the other hand, when the content of SrO decreases in glass, its meltability is liable to deteriorate and its refractive index nd is liable to lower. Thus, the lower limit content of SrO is suitably 0.1% or more, 0.5% or more, 1% or more, 2% or more, 5% or more, 7% or more, particularly suitably 9% or more.

Among alkaline-earth metal oxides, BaO is a component that increases the refractive index nd of glass without reducing its viscosity extremely, and the content of BaO is preferably 0.1 to 60%. When the content of BaO increases in glass, its refractive index nd, density, and thermal expansion coefficient are apt to increase, and the balance among the components of the glass is impaired in the glass composition, with the result that its devitrification resistance is liable to deteriorate. Thus, the upper limit content of BaO is suitably 60% or less, 53% or less, 48% or less, 44% or less, 40% or less, 39% or less, 36% or less, 35% or less, 34% or less, particularly suitably 33% or less. On the other hand, when the content of BaO decreases in glass, it becomes difficult for the glass to have a desired refractive index nd and keep a high liquidus viscosity. Thus, the upper limit content of BaO is suitably 0.1% or more, 1% or more, 2% or more, 5% or more, 10% or more, 15% or more, 20% or more, 23% or more, particularly suitably 25% or more.

The content of ZnO is preferably 0 to 20%. ZnO is a component that increases the refractive index nd of glass and its strain point and is a component that decreases its viscosity at high temperature. However, when ZnO is added in a large amount in glass, its liquidus temperature rises, with the result that its devitrification resistance may deteriorate and its density and thermal expansion coefficient may become too high. Thus, the upper limit content of ZnO is suitably 20% or less, 10% or less, 5% or less, 3% or less, particularly suitably 1% or less.

The content of MgO+CaO+SrO+BaO+ZnO is 20 to 60%. When the content of MgO+CaO+SrO+BaO+ZnO increases in glass, its density and thermal expansion coefficient tend to increase, and the balance among the components of the glass is impaired in the glass composition, with the result that its devitrification resistance is liable to deteriorate. Thus, the upper limit content of MgO+CaO+SrO+BaO+ZnO is 60% or less, preferably 55% or less, 50% or less, 48% or less, particularly preferably 45% or less. On the other hand, when the content of MgO+CaO+SrO+BaO+ZnO decreases in glass, the glass becomes unstable results. Thus, the lower limit of the content of MgO+CaO+SrO+BaO+ZnO is 20% or more, preferably 30% or more, 35% or more, particularly preferably 40% or more.

$TiO_2$ is a component that increases the refractive index nd of glass. The content of $TiO_2$ is 0.0001 to 20%. However, when the content of $TiO_2$ increases in glass, the balance among the components of the glass is impaired in the glass composition, with the result that its devitrification resistance is liable to deteriorate. In addition, the transmittance of the glass reduces, and when the glass is applied in an OLED display, its light-emitting efficiency may deteriorate. Thus, the upper limit of the content of $TiO_2$ is 20% or less, preferably 10% or less, 7% or less, particularly preferably 5% or less. On the other hand, when the content of $TiO_2$ decreases in glass, a desired refractive index nd is not easily provided to the glass. Thus, the lower limit of the content of $TiO_2$ is 0.0001% or more, preferably 0.001% or more, 0.01% or more, 0.02% or more, 0.05% or more, 0.1% or more, 1% or more, particularly preferably 2% or more.

$ZrO_2$ is a component that increases the refractive index nd of glass. The content of $ZrO_2$ is 0 to 20%. However, when the content of $ZrO_2$ increases in glass, the balance among the components of the glass is impaired in the glass composition, with the result that its devitrification resistance is liable to deteriorate. Thus, the upper limit of the content of $ZrO_2$ is 20% or less, preferably 10% or less, 7% or less, particularly preferably 5% or less. On the other hand, when the content of $ZrO_2$ decreases in glass, a desired refractive index nd is not easily provided to the glass. Thus, the lower limit content of $ZrO_2$ is 0.0001% or more, preferably 0.001% or more, 0.01% or more, 0.02% or more, 0.05% or more, 0.1% or more, 1% or more, particularly preferably 2% or more.

$La_2O_3$ is a component that increases the refractive index nd of glass. The content of $La_2O_3$ is preferably 0 to 10%. When the content of $La_2O_3$ increases in glass, its density and thermal expansion coefficient tend to increase and its devitrification resistance and acid resistance are liable to deteriorate. In addition, the material cost of the glass rises, with the result that the production cost of a glass sheet made from the glass is liable to surge. Thus, the upper limit content of $La_2O_3$ is suitably 10% or less, 5% or less, 3% or less, 2.5% or less, particularly suitably 1% or less.

$Nb_2O_5$ is a component that increases the refractive index nd of glass. The content of $Nb_2O_5$ is preferably 0 to 10%. When the content of $Nb_2O_5$ increases in glass, its density and thermal expansion coefficient tend to increase and its devitrification resistance is liable to deteriorate. In addition, the material cost of the glass rises, with the result that the production cost of a glass sheet made from the glass is liable to surge. Thus, the upper limit content of $Nb_2O_5$ is suitably 10% or less, 5% or less, 3% or less, particularly suitably 1% or less.

The content of $Gd_2O_3$ is preferably 0 to 10%. $Gd_2O_3$ is a component that increases the refractive index nd of glass. However, when the content of $Gd_2O_3$ increases in glass, its density and thermal expansion coefficient become too high, the balance among the components of the glass is lost in the glass composition, with the result that its devitrification resistance deteriorates, and its viscosity at high temperature lowers excessively, with the result that it is difficult for the glass to keep a high liquidus viscosity. Thus, the upper limit content of $Gd_2O_3$ is suitably 10% or less, 5% or less, 3% or less, particularly suitably 1% or less.

The content of $La_2O_3+Nb_2O_5$ is 0 to 10%. When the content of $La_2O_3+Nb_2O_5$ increases in glass, its density and thermal expansion coefficient tend to increase, its devitrification resistance is liable to deteriorate, and it is difficult for the glass to keep a high liquidus viscosity. In addition, the material cost of the glass rises, with the result that the production cost of a glass sheet made from the glass is liable to surge. Thus, the upper limit of the content of $La_2O_3+Nb_2O_5$ is 10% or less, preferably 8% or less, 5% or less, 3% or less, 1% or less, 0.5% or less, particularly preferably 0.1% or less.

The total content of rare metal oxides is preferably 0 to 10%. When the total content of rare metal oxides increases in glass, its density and thermal expansion coefficient tend to be higher, its denitrification resistance and acid resistance are liable to deteriorate, and it becomes difficult for the glass to keep a high liquidus viscosity. In addition, the material cost of the glass rises, with the result that the production cost of a glass sheet made from the glass tends to surge. Thus, the upper limit content of rare metal oxides is suitably 10% or less, 5% or less, 3% or less, particularly suitably 1% or less.

The following components may be added in addition to the above-mentioned components.

As a fining agent, one kind or two or more kinds selected from the group consisting of $As_2O_3$, $Sb_2O_3$, $CeO_2$, $SnO_2$, F, Cl, and $SO_3$ may be added in an amount of 0 to 3%. Note that it is preferred to use $As_2O_3$, $Sb_2O_3$, and F in an amount as small as possible from the environmental viewpoint, and each of the contents thereof is preferably less than 0.1%. In consideration of the above-mentioned points, $SnO_2$, $SO_3$, Cl, and $CeO_2$ are each preferably used as the fining agent.

The content of $SnO_2$ is preferably 0 to 1%, 0.001 to 1%, particularly preferably 0.01 to 0.5%.

The content of $SO_3$ is preferably 0 to 1%, 0 to 0.5%, 0.001 to 0.1%, 0.005 to 0.1%, 0.01 to 0.1%, particularly preferably 0.01 to 0.05%. Sodium sulfate may be used as a material for introducing $SO_3$. Further, a material containing sulfuric acid may also be used.

The content of Cl is preferably 0 to 1%, 0.001 to 0.5%, particularly preferably 0.01 to 0.4%.

The content of $SnO_2+SO_3+Cl$ is preferably 0 to 1%, 0.001 to 1%, 0.01 to 0.5%, particularly preferably 0.01 to 0.3%. Herein, the "$SnO_2+SO_3+Cl$" refers to the total amount of $SnO_2$, $SO_3$, and Cl.

The content of $CeO_2$ is preferably 0 to 6%. When the content of $CeO_2$ increases in glass, its denitrification resistance is liable to lower. Thus, the upper limit content of $CeO_2$ is suitably 6% or less, 5% or less, 3% or less, 2% or less, particularly suitably 1% or less. On the other hand, when the content of $CeO_2$ decreases in glass, the effect as a fining agent is lessened. Thus, the lower limit content of $CeO_2$ is suitably 0.001% or more, 0.005% or more, 0.01% or more, 0.05% or more, particularly suitably 0.1% or more.

PbO is a component that decreases the viscosity of glass at high temperature, but is preferably used in an amount as small as possible from the environmental viewpoint. The content of PbO is preferably 0.5% or less, and it is desirable that glass be substantially free of PbO. Herein, the phrase "substantially free of PbO" refers to the case where the content of PbO in a glass composition is less than 1,000 ppm (by mass).

It is possible to construct suitable ranges of the composition of glass by combining the suitable range of each component. Of those, suitable ranges of the composition of glass are as follows.

(1) A glass comprising, in terms of mass %, 30 to 60% of $SiO_2$, 0 to 15% of $B_2O_3$, 0 to 15% of $Al_2O_3$, 0 to 10% of $Li_2O$, 0 to 10% of $Na_2O$, 0 to 10% of $K_2O$ %, 20 to 60% of MgO+CaO+SrO+BaO+ZnO, 0.1 to 20% of $TiO_2$, 0 to 20% of $ZrO_2$, and 0 to 10% of $La_2O_3+Nb_2O_5$.

(2) A glass comprising, in terms of mass %, 35 to 45% of $SiO_2$, 2 to 8% of $B_2O_3$, 4 to 8% of $Al_2O_3$, 1 to 8% of $Li_2O$, 0 to 5% of $Na_2O$, 0 to 8% of $K_2O$, 30 to 48% of MgO+CaO+SrO+BaO+ZnO, 1 to 7% of $TiO_2$, 0.1 to 5% of $ZrO_2$, and 0 to 5% of $La_2O_3+Nb_2O_5$.

The high refractive index glass of the second embodiment has a refractive index nd of 1.55 or more, preferably 1.58 or more, 1.60 or more, particularly preferably 1.63 or more. When the refractive index nd is less than 1.55, light cannot be extracted efficiently owing to the reflectance at the interface between a transparent conductive film and a glass sheet. On the other hand, when the refractive index nd is more than 2.3, the reflectance at the interface between air and a glass sheet becomes higher, and hence it is difficult to extract light to the outside even if the surface of the glass is subjected to roughening treatment. Thus, the refractive index nd is 2.3 or less, preferably 2.2 or less, 2.1 or less, 2.0 or less, 1.9 or less, particularly preferably 1.75 or less.

The high refractive index glass of the second embodiment has a density of preferably 5.0 g/cm³ or less, 4.8 g/cm³ or less, 4.5 g/cm³ or less, 4.3 g/cm³ or less, 3.7 g/cm³ or less, 3.5 g/cm³ or less, particularly preferably 3.4 g/cm³ or less. With this, the weight of a device can be reduced.

The high refractive index glass of the second embodiment has a thermal expansion coefficient at 30 to 380° C. of preferably $45\times10^{-7}$ to $110\times10^{-7}$/° C., $50\times10^{-7}$ to $100\times10^{-7}$/° C., $60\times10^{-7}$ to $95\times10^{-7}$/° C., $65\times10^{-7}$ to $90\times10^{-7}$/° C., $65\times10^{-7}$ to $85\times10^{-7}$/° C., particularly preferably $67\times10^{-7}$ to $80\times10^{-7}$/° C. In recent years, flexibility has been imparted to a glass sheet in some cases from the viewpoint of improving design elements in an OLED device and the like. For enhancing the flexibility of a glass sheet, the thickness of the glass sheet needs to be smaller. In this case, when the thermal expansion coefficient of the glass sheet does not match to that of a transparent conductive film, the glass sheet is liable to warp. Thus, when the thermal expansion coefficient at 30 to 380° C. is controlled in any of the above-mentioned ranges, such a situation as described above can be easily prevented.

The high refractive index glass of the second embodiment has a strain point of preferably 600° C. or more, particularly preferably 630° C. or more. When a transparent conductive film is formed for a device such as an organic thin-film solar cell, as treatment is performed at a higher temperature, the formed film has higher transparency and lower electric resistance. However, conventional high refractive index glass had insufficient heat resistance, and hence it was difficult to strike a balance between high transparency and low electric resistance. Thus, when the strain point of the high refractive index glass is controlled in the above-mentioned range, it is possible to strike a balance between high transparency and low electric resistance in a device such as an organic thin-film solar cell in which the glass is used, and the glass resists thermal shrinkage even if thermal treatment is carried out in the production process of the device.

The high refractive index glass of the second embodiment has a temperature at $10^{2.5}$ dPa·s of preferably 1,450° C. or less, 1,400° C. or less, 1,350° C. or less, 1,300° C. or less, 1,250° C. or less, particularly preferably 1,200° C. or less. With this, the meltability of the high refractive index glass improves. Hence, the production efficiency of the glass improves.

The high refractive index glass of the second embodiment invention has a liquidus temperature of preferably 1,200° C. or less, 1,150° C. or less, 1,130° C. or less, 1,110° C. or less, 1,090° C. or less, 1,070° C. or less, 1,050° C. or less, 1,040° C. or less, 1,000° C. or less, particularly preferably 980° C. or less. Further, the liquidus viscosity is preferably $10^{3.5}$ dPa·s or more, $10^{3.8}$ dPa·s or more, $10^{4.0}$ dPa·s or more, $10^{4.2}$ dPa·s or more, $10^{4.4}$ dPa·s or more, $10^{4.6}$ dPa·s or more, $10^{4.8}$ dPa·s or more, particularly preferably $10^{5.0}$ dPa·s or more. With this, it becomes difficult for the glass to denitrify at the time of forming, and it becomes easier to form the glass into a glass sheet by a float method or an overflow down-draw method.

The high refractive index glass of the second embodiment preferably has a sheet shape, and has a thickness (sheet thickness in the case of a sheet shape) of preferably 1.5 mm or less, 1.3 mm or less, 1.1 mm or less, 0.8 mm or less, 0.6 mm or less, 0.5 mm or less, 0.3 mm or less, 0.2 mm or less, particularly preferably 0.1 mm or less. As the thickness of the glass becomes smaller, its flexibility increases, and alighting device with excellent design can be easily produced. However, when the thickness becomes extremely small, the glass is liable to be damaged. Thus, the thickness is preferably 10 μm or more, particularly preferably 30 μm or more.

When the high refractive index glass of the second embodiment has a sheet shape, the glass sheet preferably has an unpolished surface as at least one surface (particular preferably has an entirely unpolished, effective surface as the effective surface in at least one surface). The theoretical strength of glass is intrinsically very high. However, glass often breaks even by a stress far lower than the theoretical strength. This is because small defects called Griffith flaw are produced in the surfaces of the glass in some steps after the glass is formed into a glass sheet, such as a polishing step. Thus, when a surface of glass is not polished, the mechanical strength that the glass intrinsically has is not easily impaired, and hence the glass does not easily break. In addition, the production cost of the glass sheet can be reduced, because the polishing step can be simplified or eliminated.

The high refractive index glass of the second embodiment comprises an unpolished surface having a surface roughness Ra of preferably 10 Å or less, 5 Å or less, 3 Å or less, particularly preferably 2 Å or less. When the surface roughness Ra is larger than 10 Å, the quality of a transparent conductive film formed on the surface deteriorates and uniform light emission is not easily achieved.

The high refractive index glass of the second embodiment is formed preferably by a down-draw method, particularly preferably by an overflow down-draw method. With this, an unpolished glass sheet having good surface quality can be produced. This is because, when a glass sheet is formed by the overflow down-draw method, the surfaces that should serve as the surfaces of the glass sheet are formed in the state of a free surface without being brought into contact with a trough-shaped refractory. The structure and material of the trough-shaped structure are not particularly limited as long as the desired size and surface precision of the glass sheet can be achieved. Further, a method of applying a force to molten glass for down-drawing the molten glass downward is not particularly limited, either. For example, it is possible to adopt a method comprising rotating a heat-resistant roll having a sufficiently large width in the state of being in contact with molten glass, to thereby draw the molten glass, or a method comprising bringing a plurality of pairs of heat-resistant rolls into contact with only the vicinity of the edge surfaces of molten glass, to thereby draw the molten glass. Note that it is possible to adopt a slot down-draw method as the down-draw method, other than adopting the overflow down-draw method. With this, a glass sheet having a small thickness can be easily manufactured. Herein, the term "slot down-draw method" refers to a method of forming a glass sheet by down-drawing molten glass downward while pouring the molten glass from apertures having a substantially rectangular shape.

The high refractive index glass of the second embodiment is preferably formed by a float method. With this, it is possible to produce large glass sheets at low cost in large numbers.

A method other than the above-mentioned forming methods, such as a re-draw method, a float method, or a roll-out method, may also be adopted.

The high refractive index glass of the second embodiment is preferably subjected to roughening treatment on one of its surfaces by HF etching, sandblasting, or the like. The surface roughness Ra of the roughening treated surface is preferably 10 Å or more, 20 Å or more, 30 Å or more, particularly preferably 50 Å or more. When the roughening treated surface is arranged on the side to be brought into contact with air of an OLED lighting device or the like, because the roughening treated surface has a non-reflective structure, light produced in an organic light-emitting layer does not easily return into the organic light-emitting layer. As a result, light extraction efficiency can be enhanced. Further, irregularities may be provided in a surface of glass (thermal processing such as re-pressing). With this, a precise reflective structure can be formed in the surface of the glass. The interval and depth of the irregularities are recommended to be adjusted in consideration of the refractive index nd of the glass. Further, a resin film with irregularities may be attached on a surface of glass.

Further, when atmospheric plasma processing is adopted for roughening treatment, while the surface condition of one surface of a glass sheet is maintained, the other surface of the glass sheet can be uniformly subjected to the roughening treatment. Further, it is preferred to use a gas containing F (such as $SF_6$ or $CF_4$) as a source for the atmospheric plasma processing. With this, a plasma containing an HF-based gas is generated, and hence the efficiency of the roughening treatment is enhanced.

Further, it is also preferred to adopt a method comprising forming irregularities in one surface at the time of forming glass into a glass sheet. In this case, no independent roughening treatment is required as a separate step, and hence the efficiency of the roughening treatment applied to the glass sheet improves.

Next, a method of producing the high refractive index glass of the second embodiment is exemplified. First, a glass batch is manufactured by blending glass materials so that a desired glass composition is achieved. Subsequently, the glass batch is melted and fined, and is then formed into a desired shape. After that, the resultant is processed into a desired shape.

Example 3

Hereinafter, examples of the second invention are described in detail. Note that the following examples are merely for illustrative purposes. The second invention is by no means limited to the following examples.

Tables 5 to 12 show examples of the second invention (Sample Nos. 20 to 55) and a comparative example (Sample No. 56).

TABLE 5

|  |  | Example | | | | |
| --- | --- | --- | --- | --- | --- | --- |
|  |  | No. 20 | No. 21 | No. 22 | No. 23 | No. 24 |
| Glass composition (wt %) | $SiO_2$ | 45.0 | 50.0 | 40.0 | 40.0 | 45.0 |
|  | $B_2O_3$ | — | — | — | 10.0 | 2.5 |
|  | $Al_2O_3$ | 5.0 | — | 10.0 | — | 2.5 |
|  | CaO | 5.9 | 5.9 | 5.9 | 5.9 | 5.9 |
|  | SrO | 10.9 | 10.9 | 10.9 | 10.9 | 10.9 |
|  | BaO | 26.2 | 26.2 | 26.2 | 26.2 | 26.2 |
|  | $TiO_2$ | 4.0 | 4.0 | 4.0 | 4.0 | 4.0 |
|  | $ZrO_2$ | 3.0 | 3.0 | 3.0 | 3.0 | 3.0 |
| Refractive index nd $\lambda = 587.6$ nm | | 1.629 | 1.623 | 1.634 | 1.641 | 1.631 |
| Density [g/cm$^3$] | | 3.36 | 3.33 | 3.39 | 3.39 | 3.36 |
| Thermal expansion coefficient [×10$^{-7}$/° C.] 30 to 380° C. | | 74 | 75 | 73 | 77 | 75 |
| Ps [° C.] | | 695 | 682 | 710 | 636 | 662 |
| Ta [° C.] | | 738 | 724 | 754 | 670 | 703 |
| Ts [° C.] | | 896 | 881 | 913 | Not evaluated | 855 |
| $10^4$ dPa·s [° C.] | | 1,107 | 1,098 | 1,119 | 958 | 1,057 |
| $10^3$ dPa·s [° C.] | | 1,214 | 1,204 | 1,223 | 1,037 | 1,159 |
| $10^{2.5}$ dPa·s [° C.] | | 1,285 | 1,276 | 1,292 | 1,091 | 1,227 |
| $10^2$ dPa·s [° C.] | | 1,376 | 1,367 | 1,379 | 1,159 | 1,313 |
| TL [° C.] | | 1,070 | Not evaluated | Not evaluated | 1,138 | 1,008 |
| $\log_{10}\eta$TL [dPa·s] | | 4.5 | Not evaluated | Not evaluated | Not evaluated | 4.6 |

TABLE 5-continued

|  |  | Example | | | | |
|---|---|---|---|---|---|---|
|  |  | No. 20 | No. 21 | No. 22 | No. 23 | No. 24 |
| HCl resistance | Degree of corrosion | ◯ | ◯ | ◯ | ◯ | ◯ |
|  | Outer appearance | ◯ | ◯ | ◯ | ◯ | ◯ |

TABLE 6

|  |  | Example | | | | |
|---|---|---|---|---|---|---|
|  |  | No. 25 | No. 26 | No. 27 | No. 28 | No. 29 |
| Glass composition (wt %) | $SiO_2$ | 45.0 | 42.5 | 42.5 | 47.5 | 42.5 |
|  | $B_2O_3$ | 5.0 | 2.5 | 5.0 | — | — |
|  | $Al_2O_3$ | — | 5.0 | 2.5 | 2.5 | 7.5 |
|  | CaO | 5.9 | 5.9 | 5.9 | 5.9 | 5.9 |
|  | SrO | 10.9 | 10.9 | 10.9 | 10.9 | 10.9 |
|  | BaO | 26.2 | 26.2 | 26.2 | 26.2 | 26.2 |
|  | $TiO_2$ | 4.0 | 4.0 | 4.0 | 4.0 | 4.0 |
|  | $ZrO_2$ | 3.0 | 3.0 | 3.0 | 3.0 | 3.0 |
| Refractive index nd $\lambda = 587.6$ nm | | 1.632 | 1.634 | 1.635 | 1.627 | 1.632 |
| Density [g/cm³] | | 3.35 | 3.36 | 3.37 | 3.34 | 3.37 |
| Thermal expansion coefficient [×10⁻⁷/° C.] 30 to 380° C. | | 76 | 75 | 75 | 75 | 74 |
| Ps [° C.] | | 650 | Not evaluated | 648 | 687 | 702 |
| Ta [° C.] | | 687 | Not evaluated | 687 | 730 | 746 |
| Ts [° C.] | | 825 | Not evaluated | 829 | 890 | 904 |
| $10^4$ dPa·s [° C.] | | 1,018 | 1,059 | 1,017 | 1,101 | 1,112 |
| $10^3$ dPa·s [° C.] | | 1,110 | 1,160 | 1,111 | 1,209 | 1,218 |
| $10^{2.5}$ dPa·s [° C.] | | 1,173 | 1,227 | 1,174 | 1,281 | 1,288 |
| $10^2$ dPa·s [° C.] | | 1,252 | 1,311 | 1,254 | 1,373 | 1,378 |
| TL [° C.] | | Not evaluated | 1,001 | 987 | 1,075 | 1,169 |
| $\log_{10}\eta TL$ [dPa·s] | | Not evaluated | Not evaluated | 4.4 | 4.3 | 3.4 |
| HCl resistance | Degree of corrosion | ◯ | ◯ | ◯ | ◯ | ◯ |
|  | Outer appearance | ◯ | ◯ | ◯ | ◯ | ◯ |

TABLE 7

|  |  | Example | | | | |
|---|---|---|---|---|---|---|
|  |  | No. 30 | No. 31 | No. 32 | No. 33 | No. 34 |
| Glass composition (wt %) | $SiO_2$ | 40.0 | 40.0 | 37.5 | 40.0 | 40.0 |
|  | $B_2O_3$ | 2.5 | 5.0 | 5.0 | 5.0 | 5.0 |
|  | $Al_2O_3$ | 7.5 | 5.0 | 7.5 | 5.0 | 5.0 |
|  | MgO | — | — | — | 3.0 | 3.0 |
|  | CaO | 5.9 | 5.9 | 5.9 | 5.9 | 2.9 |
|  | SrO | 10.9 | 10.9 | 10.9 | 7.9 | 10.9 |
|  | BaO | 26.2 | 26.2 | 26.2 | 26.2 | 26.2 |
|  | $TiO_2$ | 4.0 | 4.0 | 4.0 | 4.0 | 4.0 |
|  | $ZrO_2$ | 3.0 | 3.0 | 3.0 | 3.0 | 3.0 |
|  | $SO_3$ | — | — | 0.01 | 0.01 | — |
|  | Cl | — | — | — | — | 0.01 |
|  | $CeO_2$ | — | — | — | 0.01 | — |
| Refractive index nd $\lambda = 587.6$ nm | | 1.635 | 1.636 | 1.637 | 1.634 | 1.632 |
| Density [g/cm³] | | 3.38 | 3.38 | 3.39 | 3.34 | 3.37 |

TABLE 7-continued

|  |  | Example | | | | |
|---|---|---|---|---|---|---|
|  |  | No. 30 | No. 31 | No. 32 | No. 33 | No. 34 |
| Thermal expansion coefficient [×10⁻⁷/° C.] 30 to 380° C. | | 74 | 75 | 74 | 73 | 72 |
| Ps [° C.] | | 669 | 649 | 651 | 644 | 645 |
| Ta [° C.] | | 711 | 687 | 690 | 683 | 684 |
| Ts [° C.] | | 865 | 831 | 835 | 828 | 830 |
| $10^4$ dPa·s [° C.] | | 1,066 | 1,021 | 1,022 | 1,013 | 1,020 |
| $10^3$ dPa·s [° C.] | | 1,166 | 1,116 | 1,116 | 1,104 | 1,116 |
| $10^{2.5}$ dPa·s [° C.] | | 1,232 | 1,179 | 1,178 | 1,165 | 1,181 |
| $10^2$ dPa·s [° C.] | | 1,316 | 1,259 | 1,257 | 1,242 | 1,260 |
| TL [° C.] | | 1,083 | 969 | 1,056 | 987 | 954 |
| $\log_{10}\eta$TL [dPa·s] | | 3.8 | 4.7 | 3.6 | 4.4 | 5.0 |
| HCl resistance | Degree of corrosion | ○ | ○ | ○ | ○ | ○ |
|  | Outer appearance | ○ | ○ | ○ | ○ | ○ |

TABLE 8

|  |  | Example | | | | |
|---|---|---|---|---|---|---|
|  |  | No. 35 | No. 36 | No. 37 | No. 38 | No. 39 |
| Glass composition (wt %) | $SiO_2$ | 40.0 | 40.1 | 40.0 | 40.0 | 40.0 |
|  | $B_2O_3$ | 5.0 | 5.0 | 5.0 | 5.0 | 5.0 |
|  | $Al_2O_3$ | 5.0 | 5.0 | 5.0 | 5.0 | 5.0 |
|  | MgO | 6.0 | 3.0 | 3.0 | 6.0 | 6.0 |
|  | CaO | 2.9 | 8.8 | — | 5.9 | — |
|  | SrO | 7.9 | 4.9 | 13.8 | 4.9 | 10.8 |
|  | BaO | 26.2 | 26.2 | 26.2 | 26.2 | 26.2 |
|  | $TiO_2$ | 4.0 | 4.0 | 4.0 | 4.0 | 4.0 |
|  | $ZrO_2$ | 3.0 | 3.0 | 3.0 | 3.0 | 3.0 |
|  | $SnO_2$ | — | 0.01 | 0.01 | 0.01 | — |
|  | $SO_3$ | — | 0.01 | 0.02 | — | — |
|  | Cl | 0.01 | — | — | 0.01 | — |
|  | $CeO_2$ | — | — | — | — | 0.04 |
| Refractive index nd $\lambda$ = 587.6 nm | | 1.630 | 1.637 | 1.629 | 1.633 | 1.628 |
| Density [g/cm³] | | 3.32 | 3.31 | 3.39 | 3.29 | 3.35 |
| Thermal expansion coefficient [×10⁻⁷/° C.] 30 to 380° C. | | 71 | 75 | 72 | 72 | 70 |
| Ps [° C.] | | 644 | 645 | 646 | 644 | 645 |
| Ta [° C.] | | 683 | 683 | 685 | 682 | 684 |
| Ts [° C.] | | 829 | 827 | 832 | 826 | 830 |
| $10^4$ dPa·s [° C.] | | 1,014 | 1,006 | 1,028 | 1,008 | 1,022 |
| $10^3$ dPa·s [° C.] | | 1,106 | 1,095 | 1,127 | 1,096 | 1,118 |
| $10^{2.5}$ dPa·s [° C.] | | 1,168 | 1,155 | 1,193 | 1,155 | 1,182 |
| $10^2$ dPa·s [° C.] | | 1,245 | 1,229 | 1,277 | 1,230 | 1,261 |
| TL [° C.] | | 967 | 1,026 | 983 | Not evaluated | 973 |
| $\log_{10}\eta$TL [dPa·s] | | 4.7 | 3.7 | 4.6 | Not evaluated | 4.7 |
| HCl resistance | Degree of corrosion | ○ | ○ | ○ | ○ | ○ |
|  | Outer appearance | ○ | ○ | ○ | ○ | ○ |

TABLE 9

|  |  | Example | | | | |
|---|---|---|---|---|---|---|
|  |  | No. 40 | No. 41 | No. 42 | No. 43 | No. 44 |
| Glass composition (wt %) | $SiO_2$ | 40.0 | 40.0 | 40.0 | 40.0 | 39.9 |
|  | $B_2O_3$ | 5.0 | 5.0 | 5.0 | 5.0 | 7.5 |
|  | $Al_2O_3$ | 5.0 | 5.0 | 5.0 | 5.0 | 2.5 |

TABLE 9-continued

|  |  | Example | | | | |
|---|---|---|---|---|---|---|
|  |  | No. 40 | No. 41 | No. 42 | No. 43 | No. 44 |
|  | MgO | 9.0 | 9.0 | 12.0 | — | — |
|  | CaO | 2.9 | — | — | 2.9 | 5.9 |
|  | SrO | 4.9 | 7.8 | 4.8 | 10.9 | 10.9 |
|  | BaO | 26.2 | 26.2 | 26.2 | 26.2 | 26.2 |
|  | $TiO_2$ | 4.0 | 4.0 | 4.0 | 7.0 | 4.0 |
|  | $ZrO_2$ | 3.0 | 3.0 | 3.0 | 3.0 | 3.0 |
|  | $SnO_2$ | 0.01 | 0.01 | 0.01 | 0.01 | 0.005 |
|  | $SO_3$ | 0.01 | — | — | — | — |
|  | Cl | 0.01 | 0.01 | — | — | 0.1 |
|  | $CeO_2$ | — | — | — | — | 0.005 |
| Refractive index nd $\lambda$ = 587.6 nm | | 1.629 | 1.627 | 1.626 | 1.648 | 1.638 |
| Density [g/cm$^3$] | | 3.28 | 3.30 | 3.27 | 3.38 | 3.38 |
| Thermal expansion coefficient [×10$^{-7}$/° C.] 30 to 380° C. | | 70 | 70 | 69 | 71 | 75 |
| Ps [° C.] | | 646 | 647 | 650 | 654 | 640 |
| Ta [° C.] | | 684 | 685 | 688 | 692 | 676 |
| Ts [° C.] | | 827 | 830 | 829 | 834 | 809 |
| 10$^4$ dPa · s [° C.] | | 1,008 | 1,015 | 1,024 | 1,024 | 987 |
| 10$^3$ dPa · s [° C.] | | 1,097 | 1,106 | 1,112 | 1,122 | 1,076 |
| 10$^{2.5}$ dPa · s [° C.] | | 1,156 | 1,168 | 1,167 | 1,188 | 1,136 |
| 10$^2$ dPa · s [° C.] | | 1,230 | 1,245 | 1,229 | 1,271 | 1,211 |
| TL [° C.] | | Not evaluated | Not evaluated | Not evaluated | 1,022 | 979 |
| $\log_{10}\eta$TL [dPa · s] | | Not evaluated | Not evaluated | Not evaluated | 4.0 | 4.1 |
| HCl resistance | Degree of corrosion | ○ | ○ | ○ | ○ | ○ |
|  | Outer appearance | ○ | ○ | ○ | ○ | ○ |

TABLE 10

|  |  | Example | | | | |
|---|---|---|---|---|---|---|
|  |  | No. 45 | No. 46 | No. 47 | No. 48 | No. 49 |
| Glass composition (wt %) | $SiO_2$ | 37.5 | 42.4 | 37.5 | 39.6 | 39.7 |
|  | $B_2O_3$ | 7.5 | 7.5 | 10.0 | 5.0 | 5.0 |
|  | $Al_2O_3$ | 5.0 | — | 2.5 | 5.0 | 5.0 |
|  | CaO | 5.9 | 5.9 | 5.9 | 2.9 | — |
|  | SrO | 10.9 | 10.9 | 10.9 | 13.9 | 16.8 |
|  | BaO | 26.2 | 26.2 | 26.2 | 26.2 | 26.2 |
|  | $TiO_2$ | 4.0 | 4.0 | 4.0 | 4.0 | 4.0 |
|  | $ZrO_2$ | 3.0 | 3.0 | 3.0 | 3.0 | 3.0 |
|  | $SnO_2$ | 0.005 | 0.005 | 0.005 | 0.4 | 0.2 |
|  | $SO_3$ | 0.005 | 0.01 | 0.01 | — | 0.05 |
|  | Cl | 0.005 | 0.1 | 0.005 | — | — |
| Refractive index nd $\lambda$ = 587.6 nm | | 1.639 | 1.637 | 1.642 | 1.634 | 1.632 |
| Density [g/cm$^3$] | | 3.39 | 3.38 | 3.39 | 3.36 | 3.34 |
| Thermal expansion coefficient [×10$^{-7}$/° C.] 30 to 380° C. | | 76 | 75 | 76 | 73 | 72 |
| Ps [° C.] | | 638 | 643 | 632 | 651 | 651 |
| Ta [° C.] | | 674 | 678 | 666 | 688 | 689 |
| Ts [° C.] | | 808 | 807 | 792 | 834 | 836 |
| 10$^4$ dPa · s [° C.] | | 987 | 993 | 956 | 1,025 | 1,033 |
| 10$^3$ dPa · s [° C.] | | 1,075 | 1,077 | 1,038 | 1,120 | 1,131 |
| 10$^{2.5}$ dPa · s [° C.] | | 1,136 | 1,134 | 1,093 | 1,185 | 1,199 |
| 10$^2$ dPa · s [° C.] | | 1,211 | 1,207 | 1,162 | 1,268 | 1,285 |
| TL [° C.] | | 952 | Not evaluated | 964 | Not evaluated | Not evaluated |
| $\log_{10}\eta$TL [dPa · s] | | 4.5 | Not evaluated | 3.9 | Not evaluated | Not evaluated |
| HCl resistance | Degree of corrosion | ○ | ○ | ○ | ○ | ○ |
|  | Outer appearance | ○ | ○ | ○ | ○ | ○ |

TABLE 11

| | | Example | | | | |
|---|---|---|---|---|---|---|
| | | No. 50 | No. 51 | No. 52 | No. 53 | No. 54 |
| Glass composition (wt %) | $SiO_2$ | 39.6 | 39.6 | 39.8 | 39.7 | 39.6 |
| | $B_2O_3$ | 5.0 | 5.0 | 5.0 | 5.0 | 5.0 |
| | $Al_2O_3$ | 5.0 | 5.0 | 5.0 | 5.0 | 5.0 |
| | CaO | 5.9 | 5.9 | 8.9 | 5.9 | 2.9 |
| | SrO | 7.9 | 13.9 | 10.9 | 7.9 | 10.9 |
| | BaO | 26.2 | 23.2 | 23.2 | 29.2 | 29.2 |
| | $TiO_2$ | 7.0 | 4.0 | 4.0 | 4.0 | 4.0 |
| | $ZrO_2$ | 3.0 | 3.0 | 3.0 | 3.0 | 3.0 |
| | $SnO_2$ | — | 0.05 | 0.1 | 0.1 | — |
| | $SO_3$ | — | — | — | — | 0.3 |
| | Cl | 0.2 | 0.3 | 0.1 | 0.1 | 0.05 |
| | $CeO_2$ | 0.2 | — | 0.005 | 0.1 | — |
| Refractive index nd $\lambda = 587.6$ nm | | 1.649 | 1.636 | 1.640 | 1.634 | 1.632 |
| Density [g/cm$^3$] | | 3.34 | 3.39 | 3.37 | 3.37 | 3.39 |
| Thermal expansion coefficient [×10$^{-7}$/° C.] 30 to 380° C. | | 72 | 76 | 77 | 74 | 73 |
| Ps [° C.] | | 653 | 649 | 648 | 651 | 652 |
| Ta [° C.] | | 690 | 687 | 686 | 689 | 690 |
| Ts [° C.] | | 830 | 829 | 828 | 835 | 836 |
| 10$^4$ dPa · s [° C.] | | 1,010 | 1,011 | 1,003 | 1,023 | 1,031 |
| 10$^3$ dPa · s [° C.] | | 1,101 | 1,101 | 1,090 | 1,117 | 1,128 |
| 10$^{2.5}$ dPa · s [° C.] | | 1,162 | 1,162 | 1,148 | 1,180 | 1,194 |
| 10$^2$ dPa · s [° C.] | | 1,243 | 1,241 | 1,224 | 1,261 | 1,278 |
| TL [° C.] | | Not evaluated | Not evaluated | Not evaluated | Not evaluated | Not evaluated |
| log$_{10}$ηTL [dPa · s] | | Not evaluated | Not evaluated | Not evaluated | Not evaluated | Not evaluated |
| HCl resistance | Degree of corrosion | ○ | ○ | ○ | ○ | ○ |
| | Outer appearance | ○ | ○ | ○ | ○ | ○ |

TABLE 12

| | | Example No. 55 | Comparative Example No. 56 |
|---|---|---|---|
| Glass composition (wt %) | $SiO_2$ | 39.8 | 2.5 |
| | $B_2O_3$ | 5.0 | 31.0 |
| | $Al_2O_3$ | 5.0 | — |
| | CaO | 3.9 | — |
| | SrO | 10.9 | 10 |
| | BaO | 26.2 | — |
| | ZnO | — | 0.9 |
| | $TiO_2$ | 4.0 | — |
| | $ZrO_2$ | 5.0 | 6.6 |
| | $La_2O_3$ | — | 46.0 |
| | $Y_2O_3$ | — | 11.0 |
| | $Nb_2O_5$ | — | 1.0 |
| | $SnO_2$ | 0.05 | — |
| | $SO_3$ | 0.05 | — |
| | Cl | 0.05 | — |
| | $CeO_2$ | — | — |
| Refractive index nd $\lambda = 587.6$ nm | | 1.638 | 1.773 |
| Density [g/cm$^3$] | | 3.38 | 4.12 |
| Thermal expansion coefficient [×10$^{-7}$/° C.] 30 to 380° C. | | 71 | 72 |
| Ps [° C.] | | 659 | 635 |
| Ta [° C.] | | 698 | 658 |
| Ts [° C.] | | 845 | 738 |
| 10$^4$ dPa · s [° C.] | | 1,038 | Not evaluated |
| 10$^3$ dPa · s [° C.] | | 1,134 | Not evaluated |
| 10$^{2.5}$ dPa · s [° C.] | | 1,199 | Not evaluated |
| 10$^2$ dPa · s [° C.] | | 1,283 | Not evaluated |
| TL [° C.] | | Not evaluated | Not evaluated |
| log$_{10}$ηTL [dPa · s] | | Not evaluated | Not evaluated |
| HCl resistance | Degree of corrosion | ○ | x |
| | Outer appearance | ○ | x |

First, glass materials were blended so that each glass composition described in Tables 5 to 12 was achieved. After that, the resultant glass batch was fed into a glass melting furnace and melted at 1,500° C. for 4 hours. Next, the resultant molten glass was poured on a carbon sheet to be formed into a glass sheet, followed by predetermined annealing treatment. Finally, the resultant glass sheet was evaluated for its various characteristics.

The refractive index nd is a value obtained by producing samples having a rectangular parallelepiped shape of 25 mm by 25 mm by about 3 mm, then subjecting the samples to annealing treatment at a cooling rate of 0.1° C./min in the temperature range from (annealing point Ta+30° C.) to (strain point Ps−50° C.), and subsequently measuring the refractive index nd with a refractometer KPR-2000 manufactured by Shimadzu Corporation in a state in which an immersion liquid having a refractive index nd matching to that of the samples is immersed between two glass samples.

The density is a value obtained by measurement using a well-known Archimedes method.

The thermal expansion coefficient is a value obtained by measurement of an average thermal expansion coefficient at 30 to 380° C. with a dilatometer. A cylindrical sample (having end surfaces subjected to R processing) having a size of 5 mm in diameter by 20 mm in length was used as a measurement sample.

The strain point Ps is a value obtained by measurement based on a method as described in ASTM C336-71. Note that, as the strain point Ps becomes higher, the heat resistance becomes higher.

The annealing point Ta and the softening point Ts are values obtained by measurement based on a method as described in ASTM C338-93.

The temperatures at viscosities of $10^{4.0}$ dPa·s, $10^{3.0}$ dPa·s, $10^{2.5}$ dPa·s, and $10^{2.0}$ dPa·s are values obtained by measurement using a platinum sphere pull up method. Note that, as each of the temperatures becomes lower, the meltability becomes more excellent.

The liquidus temperature TL is a value obtained by measuring a temperature at which crystals of glass deposit when glass powder that has passed through a standard 30-mesh sieve (500 μm) and remained on a 50-mesh sieve (300 μm) is placed in a platinum boat and kept in a gradient heating furnace for 24 hours. Further, the liquidus viscosity $\log_{10} \eta TL$ is a value obtained by measuring the viscosity of glass at its liquidus temperature by a platinum sphere pull up method. Note that, as the liquidus viscosity becomes higher and the liquidus temperature becomes lower, each of the denitrification resistance and the formability becomes more excellent.

The HCl resistance was evaluated according to the following method. First, both surfaces of each glass sample were subjected to optical polishing. After that, the both surfaces were partially masked and then subjected to chemical treatment under the following condition. After the chemical treatment, the masks were removed and a surface roughness meter was used to measure the height of a step formed by a masked portion and a corroded portion. The value obtained by the measurement was defined as the "degree of corrosion." The HCl resistance (degree of corrosion) was evaluated on the basis of the following criteria. When the degree of corrosion was more than 20 μm, the corrosion was represented by Symbol "x", and when the degree of corrosion was 20 μm or less, the corrosion was represented by Symbol "○". The HCl resistance (outer appearance) was evaluated on the basis of the following criteria. Both surfaces of each glass sample were subjected to optical polishing, followed by chemical treatment under the following condition, and then, the both surfaces of each glass sample were visually observed. When a glass sample was cloudy, its surfaces were rough, or cracks were found in the glass sample, the outer appearance of the glass sample was represented by Symbol "x", and when a glass sample remained unchanged, the outer appearance of the glass sample was represented by Symbol "○".

The treatment in evaluating the HCl resistance (degree of corrosion) was performed under the condition of immersing a glass sample in an aqueous solution of 10 mass % HCl at 80° C. for 24 hours. The treatment in evaluating the HCl resistance (outer appearance) was performed under the condition of immersing a glass sample in an aqueous solution of 10 mass % HCl at 80° C. for 24 hours.

As clear from the tables, each of Sample Nos. 20 to 55 were substantially free of alkali components and rare metal oxides, had a refractive index nd of 1.623 or more, and had good acid resistance. Further, each of Sample Nos. 20, 24, 27 to 37, 39, 43 to 45, and 47 to 55 had a liquidus viscosity of $10^{3.4}$ dPa·s or more. Further, each of Sample Nos. 20 to 31 had a low density even though having a high refractive index nd, and hence they can be used for reducing the weight of a device. In addition, each of Sample Nos. 20 to 31 had a thermal expansion coefficient approximating that of a transparent conductive film, and hence it is expected that the warpage of a glass sheet produced by using any of the samples can be suppressed. Further, each of Sample Nos. 20 to 25 and 27 to 55 had a high strain point, and hence it is presumed that the thermal shrinkage of the glass can be suppressed in the production process of a device. On the other hand, Sample No. 56 comprised rare metal oxides in a large amount in its glass composition, and hence had a high density and low acid resistance.

INDUSTRIAL APPLICABILITY

The high refractive index glass of the present invention has a refractive index nd of 1.55 or more and has a high liquidus viscosity. Further, the high refractive index glass of the present invention can be produced by excluding rare metal oxides from its glass composition from the viewpoint of reducing the cost of materials, and can also be produced by excluding $As_2O_3$, $Sb_2O_3$, and the like from its glass composition from the environmental viewpoint. Therefore, the high refractive index glass of the present invention is suitable for a substrate for an OLED device, in particular, a substrate for an OLED lighting device. Note that the high refractive index glass of the present invention can also be used as, for example, a substrate for a flat panel display such as a liquid crystal display, a cover glass for an image sensor such as a charge coupled device (CCD) or a contact image sensor (CIS), and a substrate for a solar cell.

The invention claimed is:

1. A high refractive index glass, comprising, as a glass composition in terms of mass %, 35 to 50% of $SiO_2$, 0 to 1.5% of $Li_2O+Na_2O+K_2O$, 0.1 to 35% of SrO, 0 to 35% of BaO, 0.001 to 25% of $TiO_2$, 0 to 3% of $B_2O_3$, and 0 to 9% of $La_2O_3+Nb_2O_5+Gd_2O_3$, and having a refractive index nd of 1.55 to 2.3.

2. The high refractive index glass according to claim 1, further comprising 0 to 3 mass % of MgO.

3. The high refractive index glass according to claim 1, further comprising 1 to 20 mass % of $ZrO_2+TiO_2$.

4. The high refractive index glass according to claim 1, wherein the high refractive index glass has a sheet shape.

5. The high refractive index glass according to claim 1, wherein the high refractive index glass has a liquidus viscosity of $10^{3.0}$ dPa·s or more.

6. The high refractive index glass according to claim 1, wherein the high refractive index glass is formed by a float method or a down-draw method.

* * * * *